US006909589B2

(12) United States Patent
Huff

(10) Patent No.: US 6,909,589 B2
(45) Date of Patent: Jun. 21, 2005

(54) MEMS-BASED VARIABLE CAPACITOR

(75) Inventor: Michael A. Huff, Oakton, VA (US)

(73) Assignee: Corporation for National Research Initiatives, Reston, VA (US)

( * ) Notice: Subject to any disclaimer, the term of this patent is extended or adjusted under 35 U.S.C. 154(b) by 0 days.

(21) Appl. No.: 10/716,866

(22) Filed: Nov. 20, 2003

(65) Prior Publication Data

US 2004/0150939 A1 Aug. 5, 2004

Related U.S. Application Data

(60) Provisional application No. 60/427,584, filed on Nov. 20, 2002.

(51) Int. Cl.$^7$ .............................. H01G 7/00; H01G 7/06
(52) U.S. Cl. ....................................... 361/281; 361/278
(58) Field of Search .................................. 361/277–281

(56) References Cited

U.S. PATENT DOCUMENTS

| | | | | |
|---|---|---|---|---|
| 5,594,171 A | * | 1/1997 | Ishida et al. ............. | 73/514.32 |
| 6,212,056 B1 | * | 4/2001 | Gammel et al. ............ | 361/277 |
| 6,694,583 B2 | * | 2/2004 | Branchevsky .............. | 29/25.42 |
| 6,815,739 B2 | * | 11/2004 | Huff et al. .................. | 257/275 |

\* cited by examiner

*Primary Examiner*—Eric W. Thomas
(74) *Attorney, Agent, or Firm*—Nixon & Vanderhye P.C.

(57) ABSTRACT

A variable capacitor device using MEMS or micromachining techniques wherein thin-films of materials are deposited, patterned and etched to form movable micromechanical elements on the surface of a substrate composed of either semiconductor, glass, metal, or ceramic material. In one embodiment of the present invention to achieve higher frequency performance as well as other benefits, the substrate is comprised of Low-Temperature Co-Fired Ceramics (LTCC). The variable capacitor is an electrostatically actuated micromechanical device and if fabricated on a LTCC multi-layered substrate material has continuous electrical connections through the layers. The same LTCC substrate material can also be used to enclose the device by selectively removing a portion of the upper substrate so as to form a cavity. The two substrates are then bonded together to enclose and protect the variable capacitor. An integrated circuit can be incorporation onto the multi-level substrate structure to enable a electronic closed-loop controlled variable capacitor module. The integrated circuit is flip-chip bonded at the bottom of the substrate structure with appropriate electrical connections between the integrated circuit and the MEMS variable capacitor device. A variation of the present invention utilizes a zipper actuation method wherein the tuning ratio of the variable capacitor is increased to very high levels. Yet another variation of the present invention utilizes a differential gap between the top and bottom electrodes such that the actuation electrodes do not physically contact one another. Yet another implementation of the present invention uses an extra set of electrodes or mechanical mechanism so as to lock the value of the capacitor indefinitely. Yet another implementation uses shaped actuation electrodes so as to linearize the relationship between the applied actuation voltage and the resultant capacitance of the device.

102 Claims, 11 Drawing Sheets

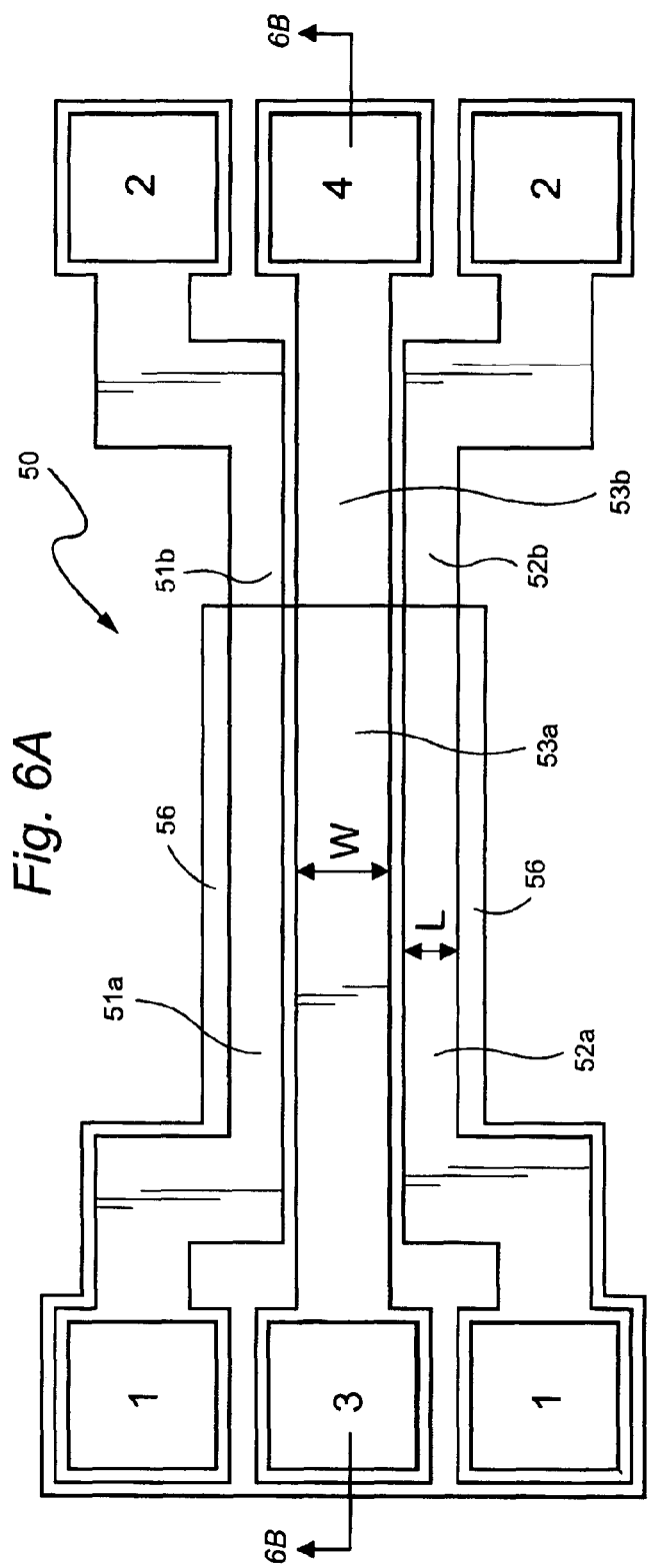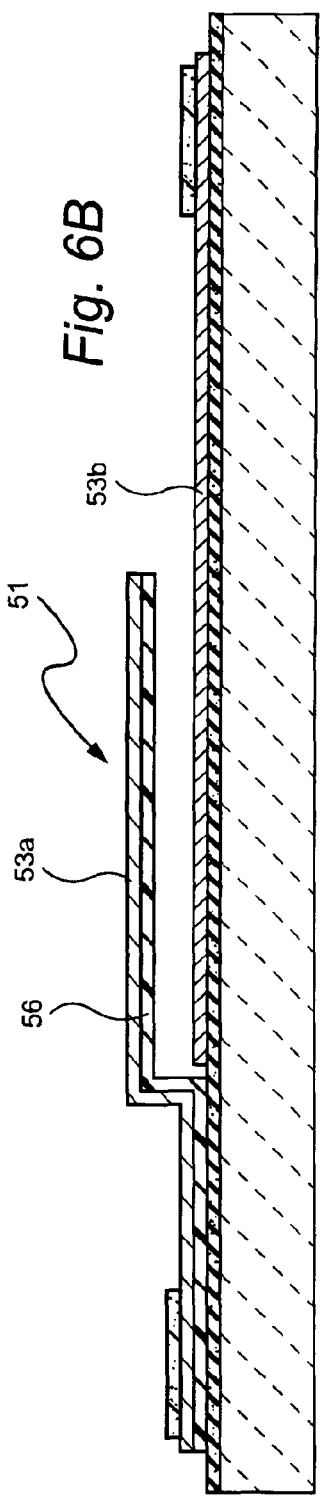

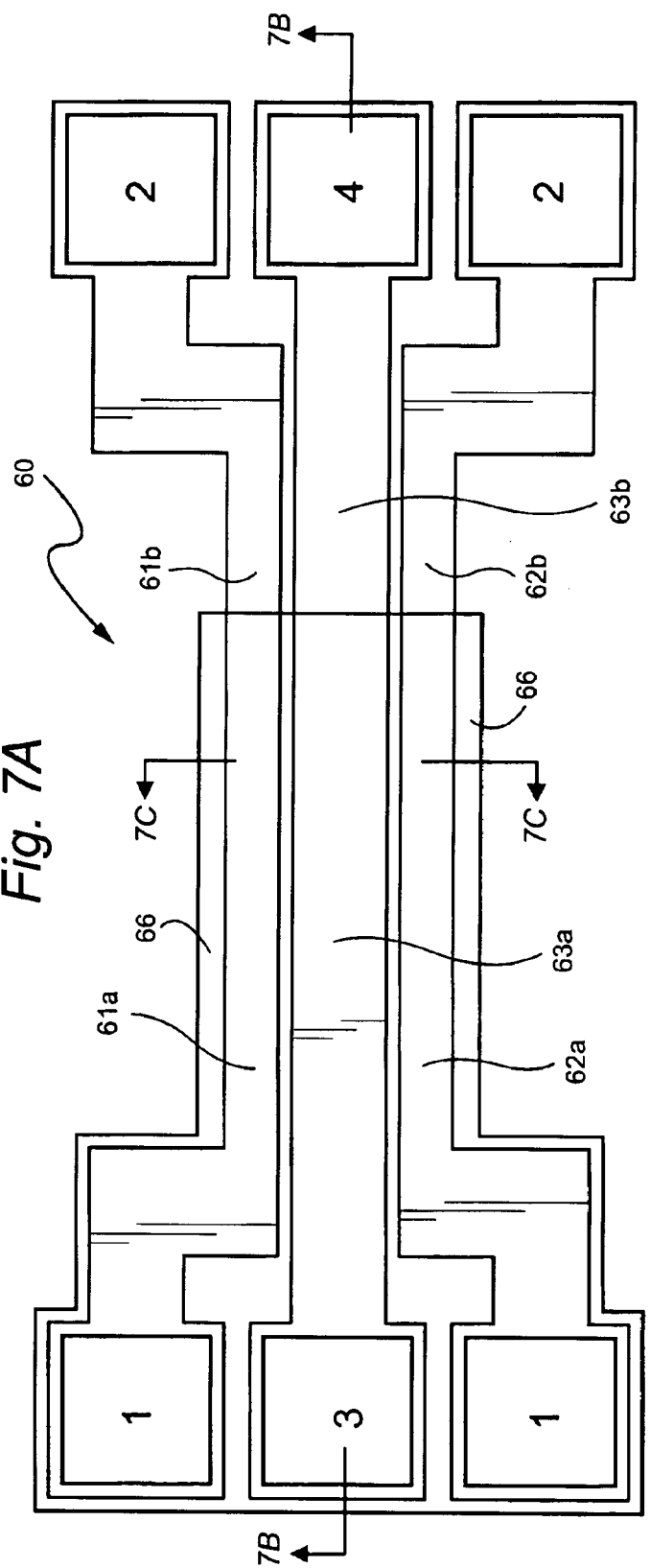
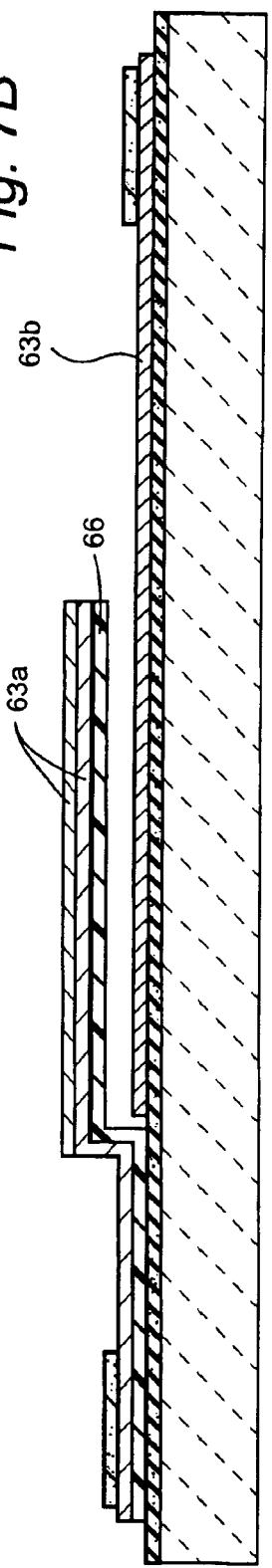

MEMS-BASED VARIABLE CAPACITOR

CROSS REFERENCE TO RELATED APPLICATION

This application is based upon provisional application Ser. No. 60/427,584, filed Nov. 20, 2002, the disclosure of which is hereby incorporated by reference herein.

FIELD OF INVENTION

The present invention relates generally to variable capacitors using MEMS or micromachining technology, and in particular, to a variable capacitor device wherein the capacitive tuning ratio and quality factor is increased to very high levels, as well as a variable capacitor device where the desired capacitance value is electronically selected and held or "locked-in" using a suitable mechanical locking or bonding mechanism, or by an active closed-loop feedback control system.

BACKGROUND OF THE INVENTION

MEMS technology is being actively developed by many organizations for implementing components and systems for application in Radio Frequency (RF) systems. The reasons for this interest relate to the distinct advantages the MEMS technology provides over competing technologies, including lower cost and higher performance. A device that is extremely useful in RF systems is the variable capacitor component, wherein the value of the capacitance of the device can be adjusted using some external means. Most prior embodiments of variable capacitors have been in the form of discrete components, wherein the capacitance of the device is adjusted by turning a screw that is coupled to variably overlapping capacitor electrodes. These devices are typically manually adjusted once on the factory floor to achieve a desired "tuned" capacitance value and then left in that state for the life of the product.

The prior discrete variable capacitor technology has several drawbacks as discussed herein. First, the prior variable capacitors are prone to drifting from the desired capacitance value to some other undesired capacitance value over time due to temperature or other environmental effects. This is because the prior variable capacitors are essentially mechanical elements composed of a variety of materials, including a high conductance metal for the electrodes and electrical interconnects, a dielectric positioned between the electrodes, and a mechanical adjustment mechanism by which the overlap of the capacitor electrodes can be adjusted over some range. In addition, each of the materials used for the capacitors has a different coefficient of thermal expansion. Consequently, the materials will expand or contract at different rates, depending on the ambient temperature, thereby resulting in a relative movement of the components in the device made from the different materials.

Second, prior variable capacitors have no capability for active tuning of the device capacitance before or during operational use. This means that once the component value of capacitance has been adjusted on the factory floor, there is no means or mechanism by which the desired capacitance value can be actively maintained or adjusted.

Third, the process of tuning prior variable capacitor devices to a desired capacitance value is a manual operation usually involving a technician, and thus is time intensive and costly. Typically, the technician must make a proper electrical connection to the device or circuit in which the device is located with some sort of test and measurement apparatus, and while monitoring some parameter, adjust the variable capacitor to a desired value by turning a screwdriver mechanism.

Fourth, the process for adjusting capacitors to a desired value is prone to error in a production line environment. Frequently, the capacitor may be turned to the wrong capacitance value. This error is typically detected in later stage testing and usually can be corrected by subsequent tuning adjustment; but this increases cost significantly. Alternatively, the device out of specification can be scraped, but this is expensive as well. Ultimately, the decision of whether to savage or scrape out of spec devices will depend on the economics of a given situation.

Fifth, the prior technology of variable capacitors has a very limited tuning range. This is primarily due to the fact that the mechanical movement is typically limited to a linear motion, and as a result, the tuning ratio (i.e., the ratio of minimum to maximum capacitance values over the entire dynamic range of the device) is generally limited to 10 to 1 or less. The disadvantage of this is that a much larger number of different variable capacitor devices with a slightly different tuning range must be made in order to have capacitors adequately cover the entire range of possible continuous capacitance values. Since almost any value of variable capacitance is desired in practical applications, the result is a significantly higher design and manufacturing costs, as well as high inventory costs, as would not be the case with a smaller number of variable capacitors with a larger dynamic range.

Sixth, the current versions of variable capacitors are large in size, and therefore, consume a larger amount of space on the mounting substrates, such as Printed Circuit Boards (PCBs), ceramic substrates, etc. As electronics technology has advanced, almost every other component or system, when viewed at the board or substrate level, has radically decreased in footprint with the exception of variable capacitors. Consequently, there is the need for variable capacitor devices which are smaller in size.

Seventh, the maximum operating frequency and the quality factors (Q) of the prior variable capacitors are somewhat limited. This is a particular problem as RF systems using these components have steadily moved into higher operational frequency ranges and the performance demands for higher signal to noise ratio and lower power consumption have increased significantly.

Finally, current variable capacitor manufacturing technology has matured to the point where the cost of making the components has been reduced substantially since the introduction of these devices decades ago. However, it is expected that very little improvement in cost reduction will be made in manufacturing these components in the future. Furthermore, despite the cost reduction achievements that have been made, these devices are still relatively expensive when compared to other components. Moreover, as pointed out above, there is a substantial additional cost associated with installing and tuning these devices compared to other components.

Although MEMS-based variable capacitors have been previously developed, all of these devices have been realized on traditional semiconductor materials, i.e., primarily silicon wafers. While this approach works for the demonstration of a device, it presents several major disadvantages for the commercialization of discrete microwave or high-frequency RF devices. First, the resistive ohmic losses of the silicon substrate are very high at high operational radio frequencies, i.e., at frequencies above 1 GHz. Second, the cost of silicon substrates and the processes used to fabricate variable capacitor devices on these substrates are too high compared to existing technologies. Third, the packaging costs of silicon, or other semiconductor material bases, are very high, particularly for devices that must operate at high frequencies and under extreme environmental conditions.

While the losses of the silicon substrate can be reduced appreciably by selectively removing the silicon from under the active devices and the associated signal paths using an isotropic etchant such as Xenon Diflouride (XeF2), this is an expensive process and one that is not readily compatible with the commercial fabrication of active MEMS devices. Consequently, the resulting manufacturing yield will be low and the cost will increase appreciably. Other semiconductor substrates having lower resistive losses can be employed for the fabrication of MEMS devices, such as Gallium Arsenide (GaAs), resulting in high performance devices. However, the cost of these materials and the costs to fabricate devices on these materials are typically two orders of magnitude higher than silicon wafers and processes. Consequently, the resulting device cost will be substantially higher than the existing macroscale variable capacitor devices. Furthermore, any semiconductor-based variable capacitor device will require a separate packaging technology that will need to be specifically developed to meet the demanding requirements of a commercial product. A conventional die package that will meet the required specifications and simultaneously have a low cost is not readily possible with today's technology.

There is enormous opportunity for MEMS technology in the application of variable capacitors, and if cost and performance goals can be met, the potential market sizes for these devices will be enormous. However, to exploit this opportunity, there is a need for new low cost and low resistive loss material onto which MEMS devices can be successfully fabricated with high yield. Furthermore, there is a need for the capability to suitably and inexpensively package these variable capacitor devices.

SUMMARY OF THE INVENTION

It is, therefore, an object of the present invention to provide a variable capacitor that can be made on a commonly used substrate in the radio frequency technology domain called Low-Temperature Co-Fired Ceramics ("LTCC"), which has excellent high-frequency performance characteristics.

It is another object of the present invention to provide a variable capacitor device wherein the packaging of the device allows environmental protection of the component as well as low manufacturing cost.

It is a further object of the present invention to provide a variable capacitor device that has lower installation, assembly, tuning and maintenance costs.

It is an object of the present invention to provide a variable capacitor with improved performance, such that the device is less prone to drift due to the effects of temperature variations or other environmental changes.

It is yet another object of the present invention to provide a variable capacitor with active tuning of the capacitance of the device using a closed-loop control feedback loop.

It is a further object of the present invention to provide a variable capacitor in which the capacitance of the device can be tuned to the correct value and then be permanently held or locked in to the desired value.

It is a further object of the present invention to provide a variable capacitor device having a lower-cost and faster means by which the desired capacitance value can be tuned.

It is yet another object of the present invention to provide a variable capacitor device having a very large tuning ratio.

It is a further object of the present invention to provide an electrostatically actuated viable capacitor mechanism.

It is yet a further object of the present invention to provide a variable capacitor in which the capacitance value is a linear function of the applied electrostatic actuation voltage potential.

It is still a further object of the present invention to provide a variable capacitor device which has a higher operational frequency and higher quality factor (Q).

It is a further object of the present invention to provide a variable capacitor device which can be made using micromechanical fabrication techniques, thereby affording the benefits of smaller size, lower cost, and increased level of integration.

It is another object of the present invention to provide a variable capacitor that has a smaller form factor.

It is a further object of the present invention to provide a variable capacitor manufacturing process that can be used to make either discrete or integrated devices at a lower cost.

These and other objectives are realized in the present invention by using a novel and very flexible fabrication methodology combined with innovative design improvements. The present invention results from the realization that micromachining technology combined with newly available materials, as well as innovative designs, allow a variable capacitor device to be embodied wherein the device will have higher operating frequency, higher quality factor (Q), lower manufacturing cost, lower installation and maintenance cost, ability for active tuning, higher tuning ratio and range, smaller size, stable and low-cost packaging, extremely stable operational performance, and provides for the making of variable capacitors in either discrete component form or integrated with highly dense, complex systems.

The present invention is a MEMS-based microfabricated discrete variable capacitor component device. This device has application in electronic and microwave circuits with projected commercial and industrial markets of hundreds of millions to billions of devices per year. For example, tunable capacitors are commonly used in Voltage-Controlled Oscillators (VCOs) as part of inductor-capacitor (LC) tank circuits to enable frequency tuning. With the growth of wireless communications, in particular market demand for smaller and more personal communication systems, there is tremendous interest and need for smaller, more stable, less costly, more power efficient components and subsystems. MEMS-based electronically-tunable variable capacitors are the only currently known technology that can exploit these tremendous market opportunities. An important component of the present invention is a process to fabricate a variable capacitor device that is extremely manufacturable using novel fabrication techniques.

The present invention combines innovative MEMS designs with a new technology to process new substrate materials to enable high performance and low cost variable capacitor devices. This new substrate material called Low-Temperature Co-Fired Ceramics (LTCC) has a cost of one to two orders of magnitude lower than silicon substrates, with even lower costs relative to other semiconductor materials such as GaAs. Furthermore, this substrate material technology is able to be batch fabricated on large dimension substrates and with comparatively low processing costs, thereby enabling extremely low costs for individual variable capacitor devices. An important part of the current invention is that the variable capacitor devices can be implemented directly on the LTCC substrates, thereby avoiding the complication of hybrid assembly approaches. The present invention also enables packaging to be performed as part of the fabrication process and without significant additional costs to the component.

The present invention addresses the major factors that are considered principal issues in the implementation of a discrete electronically-tunable variable capacitor device, namely cost and device performance. Furthermore, the device design and the method of making the device are entirely manufacturable, which allows low barrier transfer of the designs and process technologies to large-scale, high-quantity production, thereby considerably reducing time to market and the cost of transfer.

The technical specifications of a desired discrete variable capacitor device are dependent on the actual design details. An illustrative example of one embodiment of the invention is described below, but the present invention can be used for other designs/embodiments with differing technical specifications with equal ease. The package of the preferred embodiment of the device has an approximate footprint of 2 mm by 2 mm and a height of 2 mm (with resultant volume of 8 mm$^3$). The capacitance range of the device is from 0.5 pF to 10 pF. The capacitance is electronically and continuously tuned over the entire dynamic range with a tuning ratio of at least 20, but a tuning ratio of over 100 is possible. The device capacitance can be made to vary linearly with applied voltage over the full scale of capacitance values. The working voltage of the variable capacitor ranges from 50 to 100 Volts (DC) and the device is able to withstand 100 to 200 Volts (DC) without experiencing breakdown effects. The self-resonant frequency of the device is in excess of 3 GHz, and the device has a quality factor of 100 or higher at a frequency of 3 GHz. The device can have two, four, or six ports depending on the functionality required and the specific design, and is enclosed within a surface mountable package. The variation of the capacitance with temperature is less than 100 parts per million per degree Celsius. The manufacturing cost of the discrete variable capacitor device is very low in large production volumes.

The MEMS-based variable capacitor device of the present invention can be surface mounted onto a printed-circuit board or other suitable substrate during the assembly of an electrical system. After mounting of the device, a separate and external tuning circuit can be applied to the variable capacitor device or circuit containing the device and "tuned" to the desired capacitance value.

In a first embodiment of the discrete variable capacitor, the device is electronically tunable and employs a constantly applied actuation voltage to maintain the capacitor value.

In another embodiment of the discrete variable capacitor, the device capacitance is electronically tuned to a desired value and then held on that value indefinitely using some sort of "holding" or "lock-in" mechanism.

In yet another embodiment of the device, an integrated circuit is included in the package with the variable capacitor and this IC is used to sense and measure the capacitance value of the variable capacitor and apply suitable actuation voltages to the device actuation electrodes so as to keep the capacitance of the device actively adjusted to the desired value.

In the present invention, a variable capacitor device is fabricated using MEMS or micromachining techniques wherein thin-films of materials are deposited, patterned and etched to form movable micromechanical elements on the surface of a suitable substrate. MEMS technology has advanced so as to provide a well known and documented means by which devices can be made in large quantities and at low cost due to the advantages afforded by batch fabrication, wherein the processing of a single wafer results in thousands to millions of individual devices. Although the cost of processing a batch of substrates may be relatively high, this cost is amortized over many components, thereby resulting in a very low per-component cost.

In the present invention, variable capacitors are fabricated using micromachining on suitably formed substrates of a material that has recently been introduced by manufacturers, and which are generally termed Low-Temperature Co-Fired Ceramics (LTCC). LTCC material has excellent material performance characteristics for high-frequency applications. In particular, the loss tangents of LTCC are extremely low, even at high operational frequencies, and the k factor can be quite high. The LTCC substrate can be fabricated into a form factor essentially equivalent to a standard wafer and then processed using conventional microfabrication processing equipment. The LTCC wafer is typically composed of a multiplicity of layers, wherein each layer has the means by which electrical connections and interconnections, through wafer vias, discrete components, sealable cavities, and bonded integrated circuits can be incorporated with relative ease. The individual layers are aligned and stacked together, and then heat treated or "fired" to sinter the ceramic material. This results in a substrate that is strong, robust, and stable and able to be handled with ease for further processing or assembly depending on the application. Beyond the excellent high-frequency performance characteristics of the LTCC substrates is the relative ease by which complex three dimensional circuits can be formed in the layers.

Another essential feature of the present invention is the surface preparation techniques that are necessary to be performed on the LTCC wafers or substrates prior to performing micromachining fabrication techniques. In particular, the surface roughness of the LTCC material is too high to allow small linewidth features to be made on the surface of the LTCC material. Consequently, it is necessary to polish and possibly planarize the surface of the LTCC wafer or substrate, such that the surface is smooth and uniform across its entirety. The surface preparation can be accomplished using any number of means, with a preferred embodiment being the use of Chemical-Mechanical Polishing (CMP). Once this surface preparation has been performed, the LTCC material can be processed in similar fashion to silicon or other semiconductor substrates. Of course, this affords the tremendous advantage of being able to effectively use the huge and well-established infrastructure related to MEMS and integrated circuit manufacturing. Once the surface has been properly prepared, it is possible to fabricate microdevices with high precision and high fidelity. For example, it is possible using conventional photolithography to define 1 micron-sized or smaller features on the surface of LTCC substrates.

Yet another feature of the present invention is the ability to make cavities in the LTCC material substrates that can be sealed using a bonding technique. That is, a cavity can be formed in the LTCC by removing sections' specified layers prior to stacking of the layers. Once the layers are aligned and stacked and fired, a pre-defined cavity of specified dimensions will have resulted. The LTCC substrate with the pre-defined cavity can then be bonded or affixed to another substrate, such as another LTCC substrate, or perhaps a semiconductor substrate to form a well sealed and stable enclosed cavity. This can be used as a method to implement a package of a MEMS device or a integrated circuit as part of the LTCC fabrication process.

The method of fabricating the variable capacitor device of the present invention on an LTCC substrate, as described in the present invention, provides several important advantages. First, the LTCC material is well suited for high performance, high-frequency applications with its low loss tangent and high k factor value. Second, the method of fabricating micromechanical variable capacitors on LTCC material, wherein cavities can be readily made and then sealed with a controlled ambient, as well as the ability to easily accommodate electrical vias through the LTCC layers, can be utilized for packaging the variable capacitor device of the present invention. This results in a variable capacitor device wherein the package is implemented when the device is being fabricated rather than as a extra step in the manufacturing process thereby resulting in significant cost savings. Third, the ability to easily incorporate integrated circuits with suitable electrical connections onto and into the LTCC substrates can be utilized to enable an integrated circuit to be combined with the micromachined variable capacitor in the LTCC substrate package. The integrated circuit can be a device that can sense the capacitance of variable capacitor and apply a suitable actuation signal so as to adjust electronically the capacitance to a desired value, thereby providing a means to implement a closed-loop feedback controlled variable capacitor. The ability to have closed-loop or active control of the value of the capacitor provides a method to achieve a device with excellent stability, even under the most extreme of environmental variations, and is an important feature of the present invention.

The present invention also allows the tuning ratio of the variable capacitor of the present invention to be increased to very large values. The tuning ratio for a variable capacitor is the ratio of the maximum capacitance to the minimum capacitance of the device. The ability for a wider dynamic range of capacitance values in a variable capacitor device is a very desirable attribute that is not possible with prior technology implementations. The present invention includes a novel method whereby the tuning ratio can be made to extremely high values.

The present invention also provides a means by which the relationship between the actuation voltage in an electrostatically actuated variable capacitor device can be linearized with respect to the capacitance of the device. This is very useful, since in general the displacement of the moveable electrode of the variable capacitor will be a function of the squared power of the applied electrostatic voltage potential and the electrode gap spacing, thereby resulting in a non-linear voltage to capacitance relationship. The present invention provides a means by which the shape of the actuation electrode used to electrostatically actuate the moveable electrode is formed so as to provide a linear relationship between applied voltage and resultant capacitance.

Finally, the present invention also provides a means by which the desired capacitance value of the variable capacitor device can be "locked" or "held" to a desired value. This is useful so as to ensure that the capacitance value is stable over time and over changing environmental conditions. The present invention includes several means to lock or hold the capacitance value, including electrical welding, laser welding, or chemical bonding.

BRIEF DESCRIPTION OF THE DRAWINGS

FIGS. 6A and 6B are a plan view and a side-sectional view showing a variation of the variable capacitor of the present invention, which includes two pairs of actuation electrodes in addition to the variable capacitor electrodes.

FIGS. 7A–7C are a plan view and side and front sectional views showing a variation of the variable capacitor shown in FIGS. 6A–6B in which different gaps between the actuation electrodes and the capacitor electrodes are used to reduce the occurrence of stiction in the actuation electrodes.

DETAILED DESCRIPTION OF THE INVENTION

Figure 1:
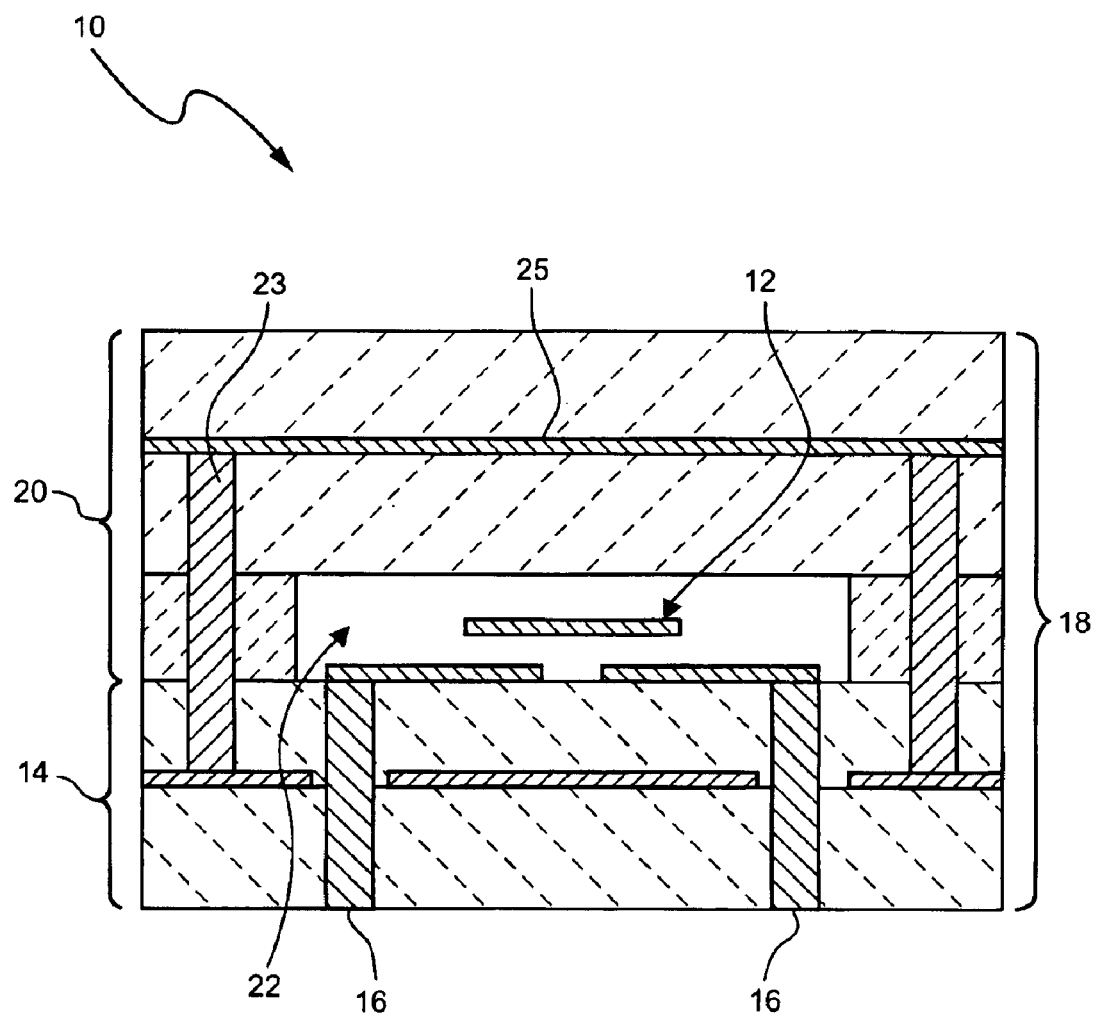
FIG. 1 is a side-sectional view of the variable capacitor of the present invention.

The present invention is directed to a variable capacitor, either in discrete or integrated form, which is used in electronic circuits. A sectional view of the discrete variable capacitor device 10 of the present invention is shown in FIG. 1. Variable capacitor 10 merges an electrostatically actuated micromechanical device 12 on a multi-layered substrate 14 having continuous electrical connections 16 through the layers 18 forming substrate 14. A second, upper substrate 20, made from the same material as substrate 14, is used to enclose device 12 by selectively removing a portion of upper substrate 20 to form a cavity 22 therein. Substrates 14 and 20 are then bonded together to enclose and protect the variable capacitor device 12. The bonding of the two substrates 14 and 20 can be performed, such that the enclosed cavity 22 is under partial vacuum or contains an inert ambient which may have importance to the operation and reliability of the micromechanical device 12.

The materials used to make substrates 14 and 20 have extremely low resistive losses, even at frequencies well above 30 GHz. This is a key differentiat or from semiconductor substrates, such as silicon onto which MEMS devices can be fabricated. This capability is extremely important for the implementation of the variable capacitor device of the present invention and is enabled by the use in the present invention of a Low-Temperature Co-Fired Ceramics (LTCC) material for substrates 14 and 20. The present invention also involves the batch microfabrication of micromechanical variable capacitor elements onto the LTCC material with high levels of precision and fidelity.

The LTCC substrate material used in the present invention allows enormous design flexibility due to its unique qualities and features. The LTCC material enables embedded passive devices, continuous electrical connections across and/or through the different layers, cavities for encapsulating various micromechanical devices or integrated circuits, flip-chip bonding of ICs onto electrical bonding pads fabricated onto the surface of the substrate, the high quality bonding of multiple layers of substrates, controlled environments within sealed cavities, and of course the fabrication of MEMS devices directly onto the surface of the material.

Another advantage of the LTCC material is its very low cost, and when this low material cost is combined with the capability of batch fabrication of micron-scaled components on the LTCC material, the cost of individual components or systems can be dramatically reduced over competing technologies.

Figure 2:
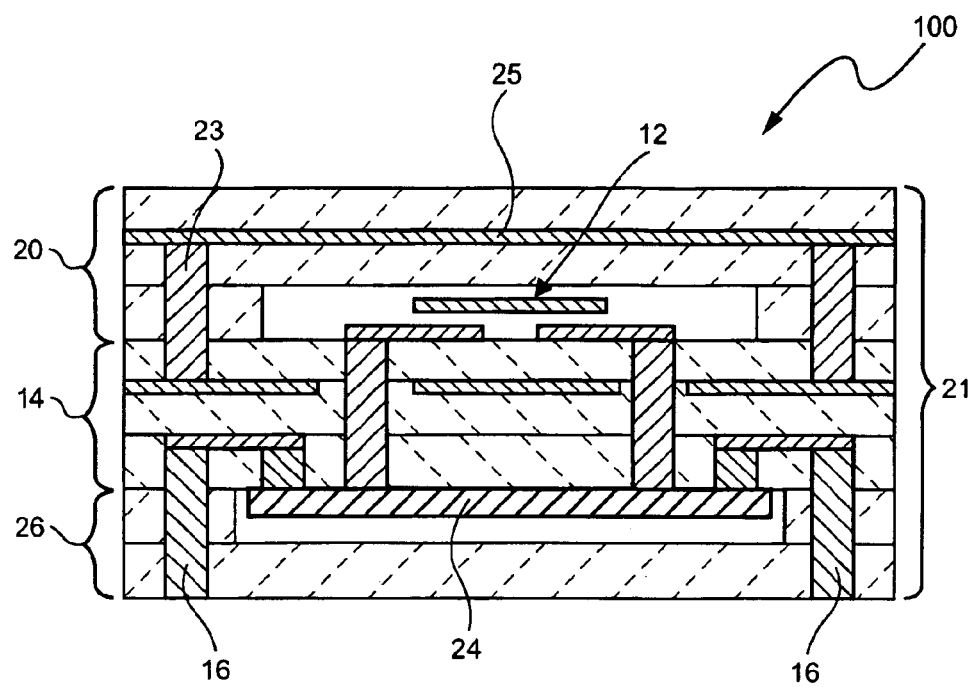
FIG. 2 is a side-sectional view of a closed-loop controlled embodiment of the variable capacitor of the present invention.

The present invention also allows the incorporation of an integrated circuit 24 onto the multi-level substrate structure 14. Integrated circuits 24 can be used to enable an electronic closed-loop controlled variable capacitor module 100 (??), as shown in FIG. 2. The embodiment of the invention shown in FIG. 2 provides enormous flexibility, and is similar to the discrete variable capacitor 10 shown in FIG. 1, with the exception of the flip-chip bonded integrated circuit 24 substrate 26 at the bottom of device 100 with appropriate electrical connections 16 between integrated circuit 24 and MEMS variable capacitor device 12 within cavity 22 at the top of module 14. Integrated circuit 24 is used to measure the sense values of variable capacitor 12, as well as calculate and control the correct voltages to the drive electrodes of variable capacitor 12.

Both of the embodiments shown in FIGS. 1 and 2 enable the package containing the variable capacitor device 12 to be surface mounted onto a ceramic substrate printed circuit board, ("PCB"), or any other commonly used substrate. Electrical connections to the variable capacitor module 10/100 are made to the external connections on the module using solder and similar techniques.

In the present invention, electrostatic actuation is the preferred method of realizing an electronically controllable moving electrode for variable capacitor device 12. Electrostatic actuation is an extremely popular technology for the implementation of movable devices that require small to moderate displacements in combination with high operating frequencies. Additionally, electrostatic actuation is the preferred method of actuation for MEMS devices made using surface micromachining techniques, such as in the present invention.

Figure 3A:
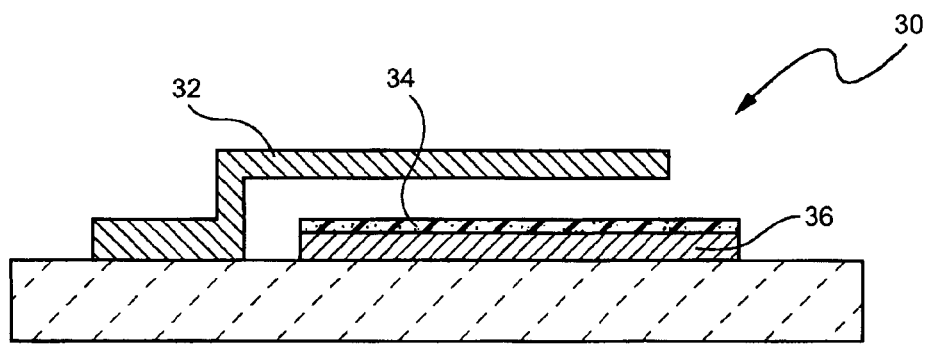
FIGS. 3(a) and (b) are side-sectional views depicting electrostatic actuation on a cantilever beam, with FIG. 3(a) depicting no actuation voltage applied and FIG. 3(b) applying voltage slightly less than collapse voltage.
Figure 3B:
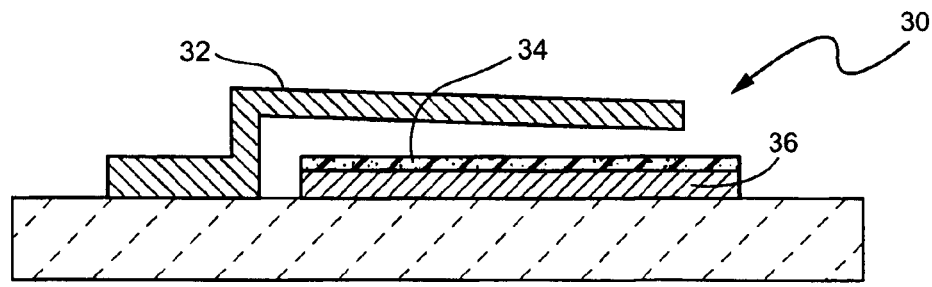

There are two undesirable effects related to the use of electrostatic actuation that are addressed in the present invention to provide for a wide dynamic range variable capacitor device. The first effect resulting from the use of electrostatic actuators 30, such as that shown in FIG. 3, is the potential instability (sometimes termed "collapse voltage" or "pull-in voltage") of the compliant electrode 32 toward the fixed electrode 34 as the gap between the electrodes is decreased with increased levels of actuation voltage. This occurs because the electrostatic force is inversely proportional to the square of the electrode separation, whereas the counteracting mechanical restoring force is typically only linear with displacement (assuming a perfect spring for the mechanical restoring force). It can be shown that collapse occurs in such a system when the displacement becomes approximately ⅓ of the initial un-deflected electrode separation. Therefore, if collapse is to be avoided in the device, the initial gap in the structure must be designed to be at least 3 times the maximum required displacement of the upper electrode. Associated with this effect is the fact that the applied actuation voltages will need to be fairly high in order to move the upper electrode. This is because the initial gap spacing between the drive and upper electrode will need to be large, namely three times the useful movable range of the upper electrode, and the electrostatically generated force is proportional to the inverse of the gap separation squared.

As a result of this effect, the prior electrostatic actuated MEMS variable capacitors have had a limited tuning range. Typically, the ranges of tuning that have been reported are no more than 25%. Theoretically, the maximum tuning range is slightly higher than this, but is in any case far short of the tuning range needed for many applications (FIG. 3).

Figure 4A:
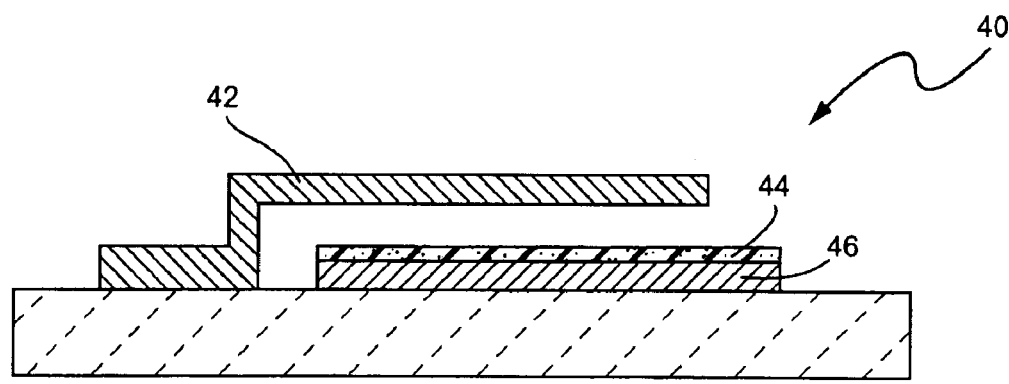
FIGS. 4(a)–(c) are side-sectional views illustrating an electrostatic zipper actuator made from a cantilever electrode.
Figure 4B:
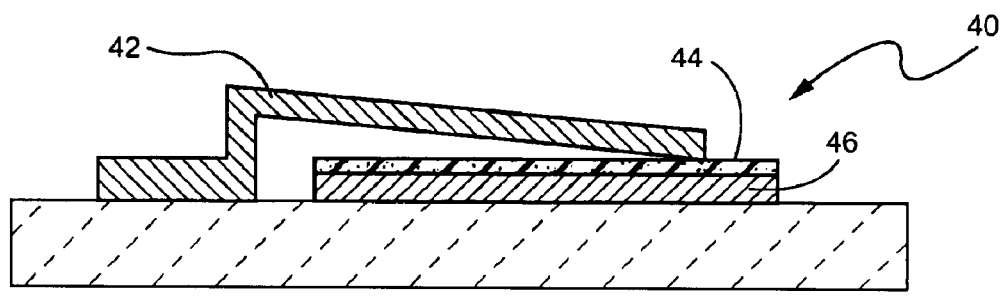
Figure 4C:
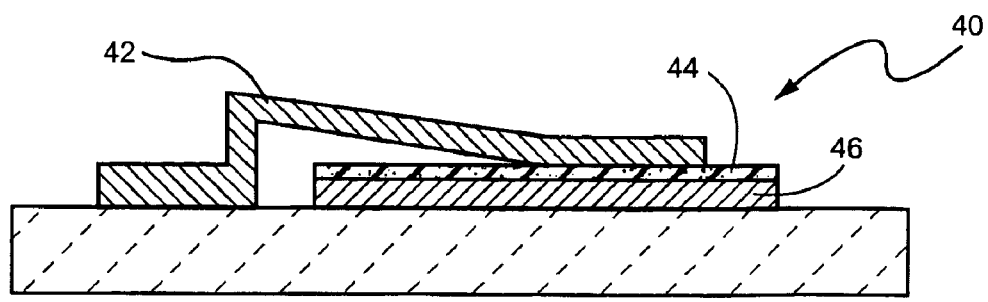

The embodiment of the present invention to overcome the tuning range limitation of electrostatically-actuated parallel plate configurations, shown in FIG. 4, is the use of a zipper actuator. In this embodiment, the upper electrode intentionally comes into contact with a mechanical stop 44 spaced above the bottom electrode 46. As the actuation voltage is increased, an increased amount of area of the upper electrode is brought into contact with the mechanical stop (FIG. 4). In the embodiment shown in FIG. 4, the mechanical stop 44 is an insulator positioned on top of bottom electrode 46. Alternatively, an insulating layer could be placed on the underside of the top electrode to achieve the same function. Similarly, standoffs on either the top or bottom electrodes could be used so as to prevent the top and bottom electrodes from electrically shorting could also be used to obtain the same functionality.

The applied DC voltage and the shape of the electrodes control the capacitance between the upper and lower electrodes 42 and 46. Furthermore, the shape of the capacitance-voltage characteristic for the device is primarily determined by the geometry of the capacitor electrodes 42 and 46. In this approach, mechanical stops, such as insulator 44, are required to prevent the upper electrode 42 from contacting the bottom electrode 46 (i.e., to prevent a short circuit between the electrodes). The mechanical stops are also used to control the tuning range of the capacitor. This approach comes at the cost of a more complex fabrication process to realize mechanical stops under the upper electrode. While not mentioned here, there are also other methods to provide for an increased moving distance of the electrode and thereby increased tuning range.

The second effect resulting from the use of electrostatic actuators is that the electrostatic force is not proportional to the applied actuation voltage, but varies with the voltage squared. In certain devices, such as clamped membranes or beams, it is possible to modify the counter electrode to somewhat linearize the relationship between actuation voltage and displacement in a certain operating range. For example, by removing the counter electrode in the center area it is possible to match the leveraging of the beam to the non-linear relationship between actuation voltage and electrostatic force, to achieve a close to linear relationship. For a suspended structure, the whole structure deflects uniformly and therefore the electrostatic force will also be uniform, and there is no non-uniformity to match to the non-linear actuation force. A technique to linearize the response of a suspended structure would be to create non-linear suspension springs for the structure. This method does require extensive mechanical numerical modeling and is difficult to implement in practice.

Even though the actuation force is a non-linear function of the applied voltage for the non-contacting electrode arrangement, this problem can be reduced or nearly eliminated with the zipper electrode configuration shown in FIG. 4. It this configuration, the capacitance can be made to vary nearly linearly with the applied voltage using a specially designed electrode. The way this is done is to have the area of the nearly contacting surfaces, namely after collapse of the upper electrode 42 into the mechanical stop 44, compensate for the non-linear electrostatic versus voltage effect. The exact shape of electrode 42 to linearize the relationship between applied actuation voltage and device capacitance will generally require numerical modeling to properly design the shape of the electrodes for a desired applied actuation voltage versus resultant capacitance relationship.

The preferred embodiment of the present invention relies on electrostatic actuation as the means to adjust the capacitance of the device 12, since electrostatic actuation is a direct energy conversion whereby the voltage signal directly causes a mechanical movement. Other actuation methods, such as bimetallic and shape memory alloys, require a conversion from electrical to thermal to mechanical, and therefore, are not as efficient. Another benefit is that electrostatic actuation is inherently compatible with electronics. Yet another benefit of electrostatic actuation is that it has the fastest speed, since the mechanical bandwidth of the device is proportional to the square root of the ratio of the stiffness of the spring and the mass of the element (assuming a small device capacitance and series resistance which will be the case for a MEMS variable capacitor). Since the mass of the moving element can be made very small and the stiffness of micromechanical springs is very high, the resultant mechanical bandwidth can be quite high compared to other actuation methods. A high device bandwidth may be particularly important in certain applications.

Although electrostatic actuation for non-collapsing structures typically require high voltages due to the inherently small electrostatic forces generated, this problem is lessened using zipper actuation. In this embodiment, the initial electrode gap can be made quite small while still achieving a relatively large tuning range. With this embodiment, tuning ratios in excess of 100 are possible with applied actuation voltages of far less than 50 Volts.

Another substantial advantage is that electrostatically actuated variable capacitor devices for this application can be made with a relatively simple and low-cost surface micromachining processes.

The variable capacitor device can be made from a selection of thin-film materials, such as gold, silver, platinum, aluminum, as well as other metals. The reliability of the device of the present invention is excellent.

Another design issue of an electrostatically-actuated variable capacitor is whether the device will be a one-port or two-port device A six port device is also described wherein the functionality of the device is increased to provide a locking or holding mechanism of the desired capacitor value). The advantage of the one port, two terminal approach is that it is very simple. The disadvantage is that the actuation voltage and the voltage on the capacitor are coupled. A much better approach and the preferred embodiment of the present invention is the two-port, four terminal design wherein separate electrodes are used to realize the variable capacitor and the electrostatic actuator (See FIGS. 6, 7 and 8).

The LTCC substrate material of the variable capacitor used with the present invention has very low resistive losses at high frequencies, which is extremely important in satisfying the requirements for the device in high-frequency and radio frequency applications. The dielectric constant of the material ($\epsilon_r$) is 7.5+/−0.1 and the loss tangent is 0.001. For example, this material allows transmission lines having losses as low as 0.2 dB/cm at 30 GHz to be realized.

Using LTCC as the substrate material for the variable capacitor of the present invention is inherently very cost-effective compared to alternative approaches, such as fabricating MEMS on silicon or MEMS on GaAs, while also allowing high fidelity photolithography to be used to make high-precision and high performance micromachined elements. The substrate material is composed of a stack of layers, wherein each layer can be uniquely patterned with openings that can be filled with low shrinkage highly conductive inks to provide electrical connections through the layers. Metal lines or other features can be patterned using photolithography on the surfaces of the layers with a minimum resolution of approximately 20 microns. This resolution increases to 100 microns if the lower cost alternative method of screen printing is used. The metal materials, which can be deposited and patterned on the substrate layers, are excellent conductors and include gold, silver and copper. These are the preferred materials to use for high frequency microwave applications. The individual layers 21 (FIGS. 1 and 2) can then be stacked together and bonded to form a composite substrate in which electrical feed-throughs 23 can span through multiple layers. Also, the metal conductor lines on the surfaces of the substrates can be enclosed with the stacked layers. Passive components such as resistors and capacitors or ground planes can also be realized on the substrate surfaces and sealed in the multi-layered substrate stack. Additionally, cavities 22 can be carved out of the multi-layered substrates that can be used to package a micromechanical element such as a variable capacitor 12 or an integrated circuit 24.

Although the present invention encompasses the manufacturing of variable capacitors on LTCC wafers having a form-factor similar to semiconductor wafers, the cost of manufacturing the variable capacitors can be further decreased by performing the processing on large sheets of LTCC material. The LTCC substrate material can be processed in sheets as large as 1 m by 1 m and the processes used to form vias, cavities and patterned metalized features are all relatively very low cost compared to conventional microfabrication techniques. As stated above, the minimum feature resolution on the untreated surface of the substrates is limited to about 20 microns. This resolution is not sufficient to make high-precision micromechanical elements, such as MEMS variable capacitors. However, the patterning resolution can be reduced to 1 to 2 microns or less with suitable surface preparation techniques as described in a prior patent application Ser. No. 10/147,907, filed May 20, 2002. These surface preparation techniques allow the patterning of highly-precise micromechanical components on the surface with high fidelity, which is very important for this device implementation.

The LTCC material can be readily formed into a wide variety of sizes and form factors depending on the constraints of the manufacturer. For example, the LTCC material can be easily formed into 100 mm, 150 mm, or 200 mm or larger wafers with a form factor essentially identical to silicon or semiconductor wafers. This allows the LTCC material to be processed on convention and existing microfabrication processing equipment. Alternatively, the LTCC material can be formed into a larger panels and processed on flat panel display processing equipment. This latter approach provides for larger volumes at low production costs. This allows the advantage to process smaller wafers, such as 100 mm diameter wafers, of this material rather than large sheets or larger diameter wafers in the development stage to refine the design of the device on existing fabrication equipment and thereby implement the prototypes at very low cost. Nevertheless, the process is immediately transferable to large-scale production without necessarily incurring huge capital equipment costs or other costs associated with the transfer of the process technology from prototyping to production.

A further advantageous attribute of the implementation method for the variable capacitor of the present invention is that it enables the signal paths to be well shielded from interfering electromagnetic signals or noise. Shielding is achieved on the surfaces by appropriately laying out coaxial lines wherein the signal line has ground lines 25 on either side. The vertical connections of the signal lines can also be enclosed in a coaxial line so as to minimize internal reflections and losses between multiple layers. This will greatly improve the performance of the device at higher operational frequencies. While coaxial connections are very useful for microwave components, they are in practice very difficult and expensive to realize using conventional processing techniques on semiconductor materials such as silicon or GaAs. This feature, combined with the low losses of the substrates and excellent conductivity of the capacitor materials, will enable very high quality factors (Q's) to be realized for variable capacitor devices.

The micromechanical devices can be fabricated directly on the surface of a multi-layer stack of the LTCC substrate material. The LTCC substrates can be designed and the design file sent to an existing LTCC foundry to make LTCC wafers or substrates meeting the desired specifications. Special surface preparation are performed on the surface of the LTCC wafers or substrates prior to fabrication of the micromechanical elements. Subsequent to this surface preparation, minimum features of 1 to 2 microns or less can be resolved to implement the MEMS variable capacitor devices.

The packaging of the variable capacitor 12 is accomplished by bonding two pieces 14 and 20 of the substrate material together, wherein one of the pieces 14 has the micromechanical device 12 fabricated on the surface, and the other 20 has a cavity 22 as shown in FIGS. 1 and 2. The bonding of the two substrates 14 and 20 is performed using eutectic bonding, glass-frit or thermosetting polymers techniques. A hermetic seal can be readily achieved in this bonding process and the micromechanical device can be enclosed in a low-pressure, low humidity environment. It may also be advantageous to incorporate a treatment of the surfaces of the micromechanical device 12 so as to avoid contamination, as well as reduce likelihood of chemical corrosion. Perhaps most important, these surface treatments help to reduce unwanted stiction effects between the contacting surfaces. Surface treatments such as a Self-Assembled Monolayer (SAMs) are commercially available for this purpose.

Figure 5:
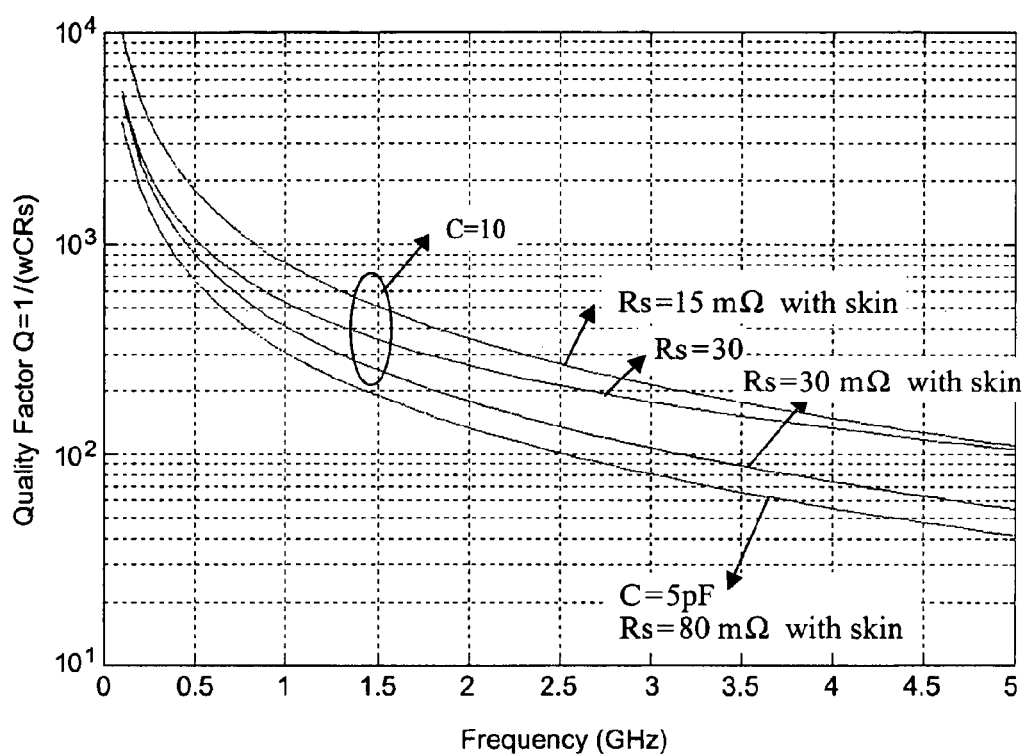
FIG. 5 is a graph showing quality factor versus frequency for various ideal capacitors.

It is helpful to look at the ideal quality factor, Q, of a capacitor at various frequencies to understand what is theoretically possible with such a device. FIG. 5 below shows three curves for a 10 pF capacitor and one curve for a 5 pF capacitor. These curves are shown at very low values of series resistance, some of which include the skin effect (the tendency of the mobile electrons to be confined to the surface of the material at higher frequencies).

These curves neglect parasitic capacitances and inductances in the devices, hence the term "ideal capacitor." As can be readily seen in FIG. 5, the series resistances of these devices have a large influence on the resultant Q. It is desirable to have the series resistance to be as low as possible in order to maximize Q. The values of resistance assumed in these curves are very low when compared to the sheet resistance of very low conductivity materials such as gold and silver (sheet resistance of these metals are on the order of 30 milli-ohm per square or more depending on the exact thickness). To get an actual resistance as low as in FIG. 5 presents some significant design and fabrication challenges, but is possible with the approach described in the present invention. It should be pointed out that the only way to lower the resistance below the values shown in FIG. 5 would be to use a superconductor material. However, this has many disadvantages such as very high cost and the need for active cooling.

The present invention provides the capability of "holding" or "locking in" a desired tuned capacitance value. One approach is to tune the variable capacitor to the desired value and apply a very short, low-voltage, high-current pulse of sufficient duration to essentially "weld" contacting electrodes together at a desired capacitance value. This technique is somewhat similar to some wafer bonding techniques commonly used in microfabrication. For example, it is well known that wafers having metal on the surface can be bonded together with excellent resultant bond strength and yield. Preferably, an extra set of electrodes wherein the metal materials of the top and bottom electrodes would be incorporated in this implementation, These extra electrodes would be used to fuse the metals layers together once the desired capacitance value of the device had been reached.

Another approach to "hold" the desired capacitance value is to apply a suitable fast curing polymer material to the device so as to affix it at the desired position, thereby locking-in the tuned capacitance value.

Yet another approach is to use a high-powered laser to weld the electrodes at the tuned position so as to "lock-in" the device to the desired capacitance value. A similar technology is already practiced in microfabrication manufacturing. For example, lasers are commonly used in manufacturing of laptop computer displays for the annealing of the thin-film transistors comprising the individual pixels in the display system. These lasers have been optimized for high scan rates and low dwell times and consequently the cost of the annealing process is relatively low. The advantage of this type of process for welding of the electrodes is that no additional electrical field will be superimposed on the electrostatic tuning signal, as in the case of the electronic welding described above.

Yet another approach is to use a mechanism whereby the moveable electrode is locked into place permanently using an electrical signal. The electrical signal provides for an electrostatic actuation force to be applied to the locking mechanism and move the lock into position so as to affix the movable electrode in the proper position.

The embodiment of FIG. 2 uses a closed-loop controlled system to actively sense and accurately control the capacitance value of the variable capacitor device 12. The closed-loop controlled device 100 is essentially identical to the discrete variable capacitor 10 shown in FIG. 1, with the exception that module 100 contains an integrated circuit, more layers of substrate material, and more electrical connections. The integrated circuit 24 is an important part of the closed-loop controlled device 100. Circuit 24 has the ability to accurately measure the actual capacitance of the variable capacitor 12 over the entire dynamic range as well as control the level of voltage applied to the electrodes driving the actuator. The relatively high voltages needed to drive the actuator may be generated on-chip or off-chip, depending on the cost and voltage levels of commercially available integrated circuit processes.

Additional complexity will be necessary for the fabrication of device 100, as compared to discrete variable capacitor 10. This complexity relates to the need to provide for additional layers of substrate material in order to make electrical connections to the integrated circuit die and the variable capacitor device, as well as connections from the integrated circuit die to the outside of module 100.

The embodiment of the variable capacitor of the present invention shown in FIGS. 6A and B is a variation wherein there are two pairs (one each of a top and bottom electrodes) of actuation electrodes 51 (51a/51b) and 52 (52a/52b) on either side of the pair of electrodes 53 (53a/53b) forming a variable capacitor 50. Each of top electrodes 51a/52a/53a is formed on a dielectric layer 56 that acts as a mechanical stop between such electrodes and bottom electrodes 51b/52b/53b, respectively. Generally, the applied electrostatic potential to the two pair of actuation electrodes 51 and 52 on either side of the variable capacitor electrodes 53 will be equal in polarity and magnitude. The applied electrostatic potential between the actuation electrodes 51 and 52 will result in an electrostatically generated force of attraction between the electrodes. As the applied voltage is increased, the force will overwhelm the mechanical stiffness of the top cantilever electrodes 51a and 52a and cause them to deflect, so as to bend in the direction of the bottom electrodes 51b and 52b, respectively, and thereby decreasing the gap between the top and bottom electrodes 51a/51b and 52a/52b. The variable capacitor device 50 can be operated in a manner similar to the variable capacitor device 100 shown in FIG. 4, in that a zipper actuation action can be implemented so as to increased the ratio of maximum and minimum capacitance of the device 50, i.e, increase the tuning ratio of the device 50.

FIG. 6 shows the variable capacitor electrodes 53 having a width W and each of the two actuator electrodes having a width L. The exact value of W and L is tailored to the specific device performance requirements and design constraints for a given application. For example, if the cantilever of the top electrode 53a is very stiff, then the width L of the actuator electrodes may need to be increased to increase the electrostatic force and overcome the bending stiffness of the top electrode cantilever. Similarly, the magnitude of the gap between the top and bottom electrodes 53a and 53b will be determined by the fabrication process as well as the specific device performance requirements and design constraints.

The advantage of the design shown in FIGS. 6a and 6b over that of the variation of the invention shown in FIG. 4 is that the actuation and variable capacitor electrodes are distinctly separated in the device shown in FIG. 6 thereby enabling the actuation and capacitor signals to be separated. Another advantage of the device in FIGS. 6a and 6b is that this implementation will suffer from less effects of dielectric charging which can result in an offset in the actuation voltages or sticking of the top and bottom electrodes together.

Any number of materials can be used to implement the microdevice shown in FIGS. 6a and 6b. Preferably, for RF applications, a high conductance metal such as gold, silver, copper, aluminum, or any metal with low resistance and which can be deposited using thin-film processing techniques could be used for the electrodes. The dielectric could be any number of commonly used thin-film insulators such as silicon nitride, silicon dioxide, polymer layer, oxynitride, or other thin-film deposited material with good dielectric properties.

Figure 7C:
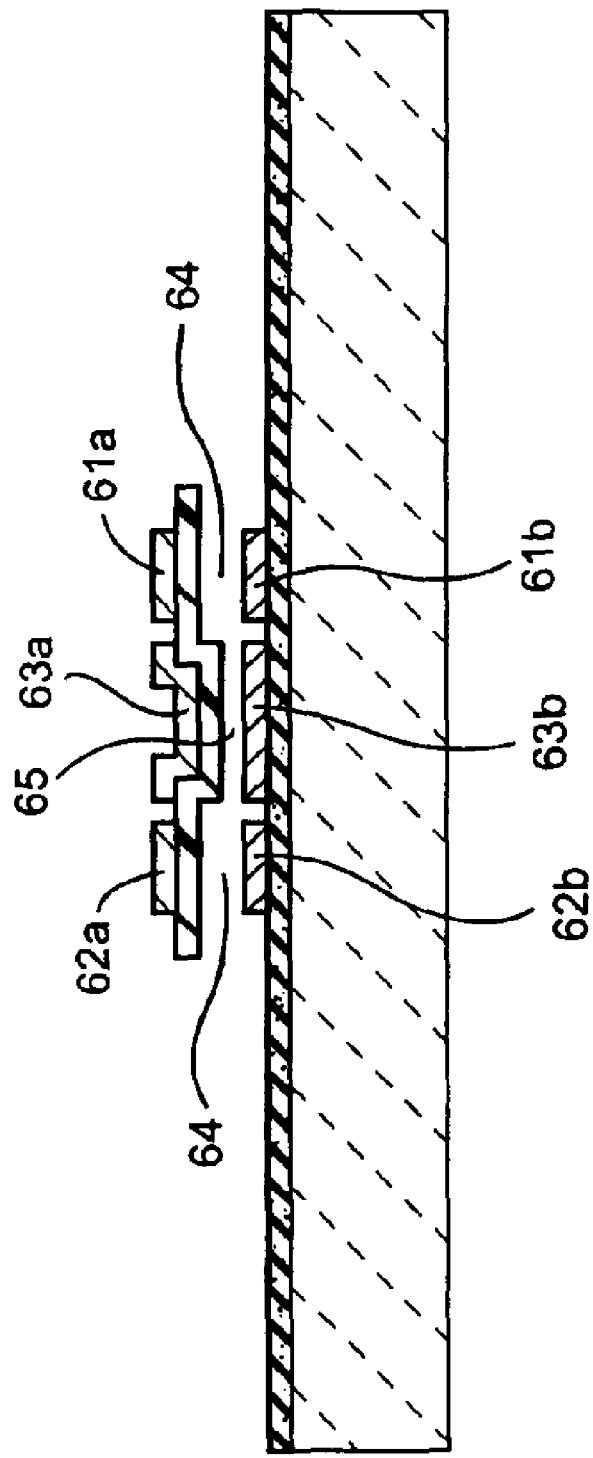

The embodiment of the variable capacitor of the present invention shown in FIGS. 7a through 7c is very similar to the variable capacitor 50 shown in FIGS. 6a and 6b. Here, again, there are two pairs (one each of a top and bottom electrodes) of actuation electrodes 61 (61a/61b) and 62 (62a/62b) on either side of the pair of electrodes 63 (63a/63b) forming a variable capacitor 60. Each of top electrodes 61a/62a/63a is again formed on a dielectric layer 66 that acts as a mechanical stop between such electrodes and bottom electrodes 61b/62b/63b, respectively. However, variable capacitor 60 shown in FIGS. 7a and 7b includes the additional improvement of having a gap 64 between each pair of top and bottom actuation electrodes 61a/61b and 62a/62b greater than the gap 65 between the top and bottom electrodes 63a/63b of variable capacitor 60. The advantage of this configuration is that the top and bottom actuation electrodes 61a/61b and 62a/62b never come into physical contact with each other during operation, and this reduces the susceptibility of the actuation electrodes to stick together, principally through the phenomenon of dielectric charging.

Figure 8A:
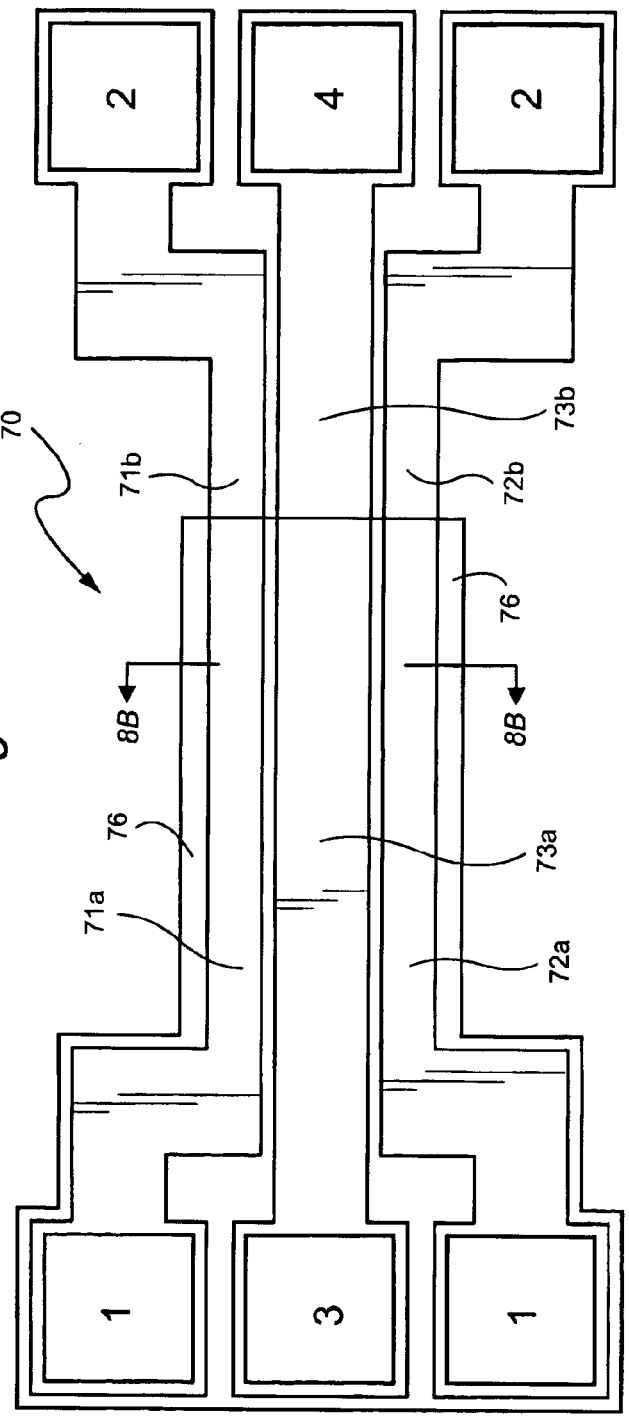
FIGS. 8A and 8B are a plan view and a front sectional view showing another variation of the variable capacitor shown in FIGS. 6A–6B with the additional improvement of dimples or standoffs being added to the electrodes to prevent contact during operation to reduce the occurrence of stiction.
Figure 8B:
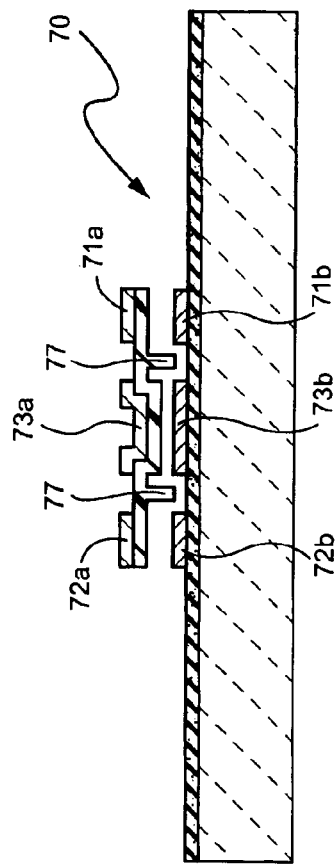

The embodiment of the variable capacitor of the present invention shown in FIGS. 8A and 8B is another variation of the devices shown in FIGS. 6A–6B and 7A–7C, but with the additional improvement of dimples or standoffs 77 being added to the dielectric layer 76 on which top electrodes 71a/72a/73a are formed. There are two pairs (one each of a top and bottom electrodes) of actuation electrodes 71 (71a/71b) and 72 (72a/72b) on either side of the pair of electrodes 73 (73a/73b) forming a variable capacitor 70. Each of top electrodes 71a/72a/73a is again formed on a dielectric layer 76 that acts as a mechanical stop between such electrodes and bottom electrodes 71b/72b/73b, respectively. Also, gap 74 between each pair of top and bottom actuation electrodes 71a/71b and 72a/72b greater than the gap 75 between the top and bottom electrodes 73a/73b of variable capacitor 70. The dimples 77 prevent both the variable capacitor electrodes 73 or the actuation electrodes 71 and 72 from coming into contact during operation, and this further reduces the occurrence of dielectric charging or stiction.

Figure 9A:
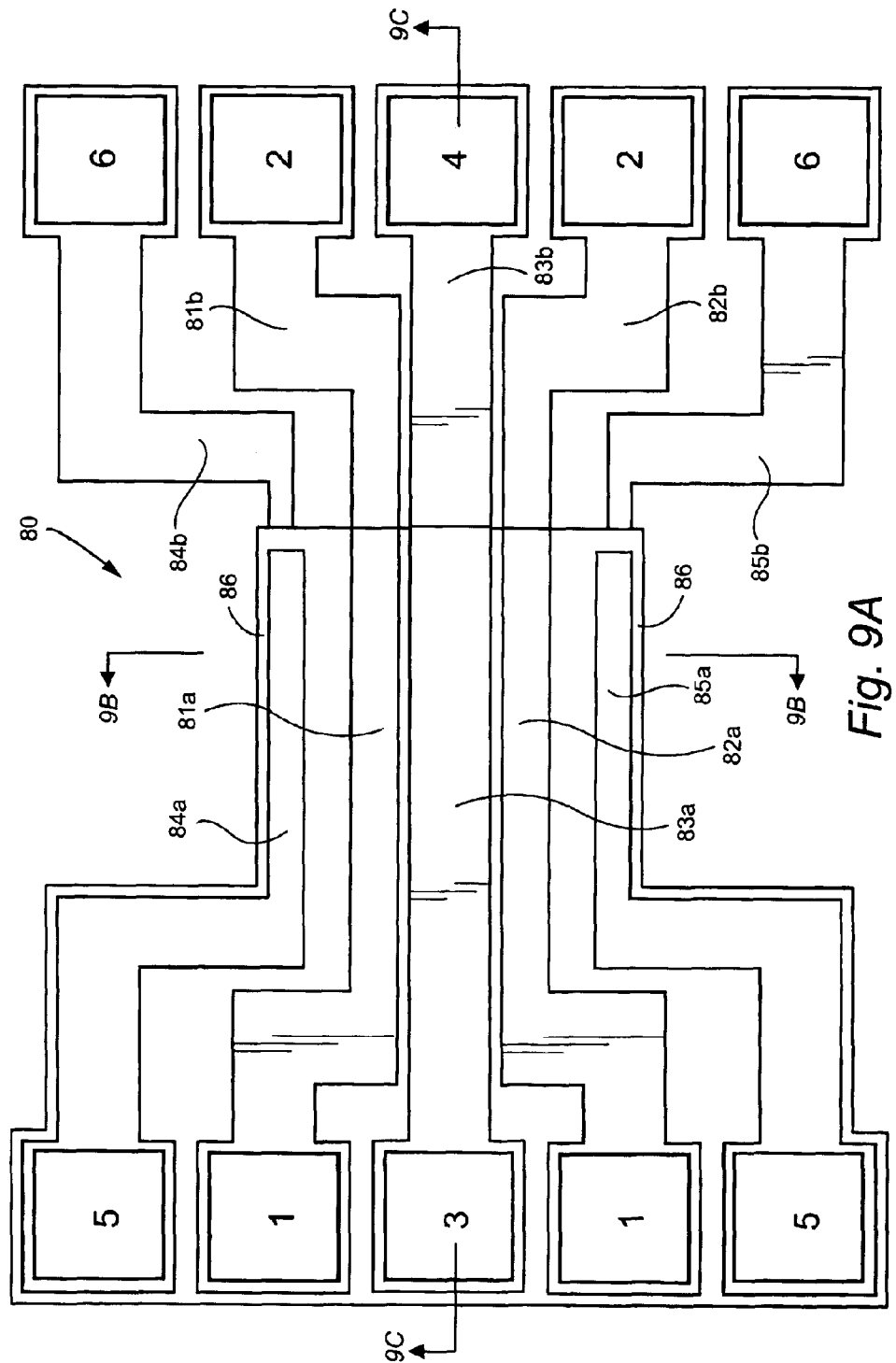
FIGS. 9A–9C are a plan view, front elevational view and side-sectional view showing another variation of the variable capacitor shown in FIGS. 6A–6B in which two additional sets of electrodes have been added for purposes of implementing a mechanical locking mechanism to fix the variable capacitor at a certain capacitance value.
Figure 9B:
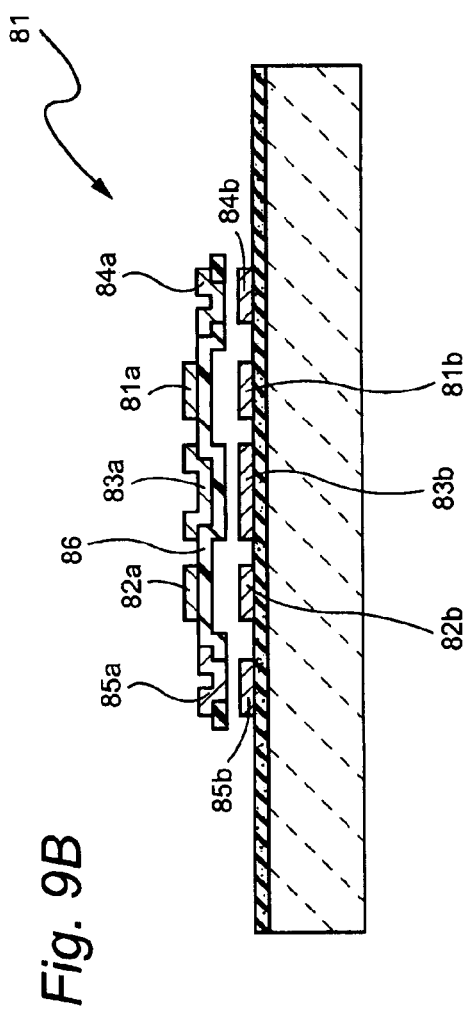
Figure 9C:
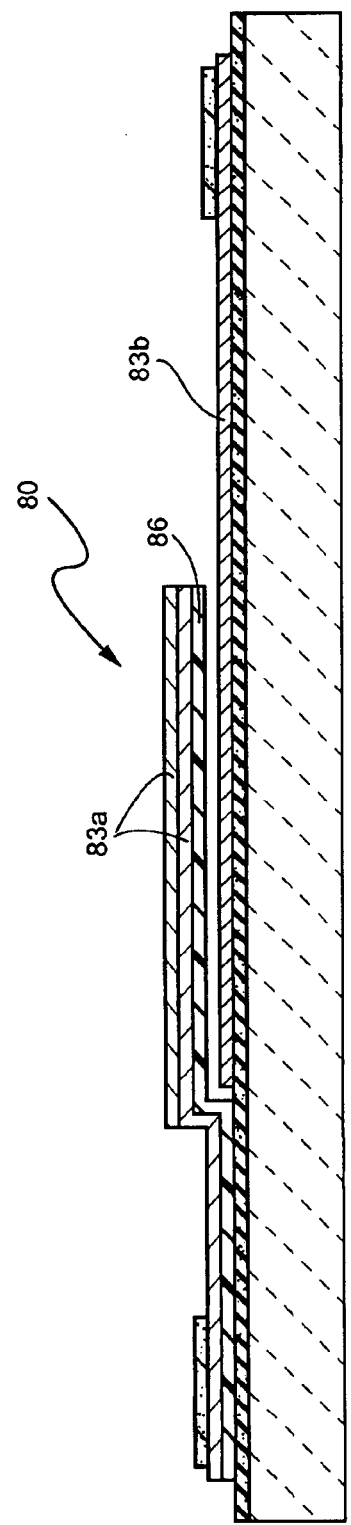

The embodiment shown in FIGS. 9A–9C is similar to the embodiments of the variable capacitor device shown in FIGS. 6A–6B, 7A–7C and 8A–8B, except that two sets of additional electrodes 84 and 85 have been added on either side of actuator electrodes 81 and 82. Here again, each of the actuator electrodes 81 and 82 has a top and bottom electrodes (81a/81b) and (82a/82b), as do the electrodes 83 (83a/83b) forming variable capacitor device 80. The device 80 operates in similar fashion to the previous devices wherein an electrostatic voltage potential is applied to the actuator electrodes 81 and 82, thereby causing the cantilever to deflect and decreasing the separation between the top and bottom electrodes 81a/81b and 82a/82b. The difference in the operation of the device shown in FIGS. 9A–9C is that the outside electrodes 84 and 85 have the metallic layer of the top and bottom electrodes 84a/84b and 85a/85b come into intimate physical contact, and if a high current pulse of sufficient magnitude is passed through the top and bottom electrode when the cantilever is the desired deflected position, the metal of electrodes 84 and 85 will undergo a slight melting and will fuse together, thereby locking the cantilever in the deflected position permanently and fixing the variable capacitor to a certain capacitance value indefinitely. Alternatively, the top and bottom outer electrodes 84 and 85 could be pulsed with a high-power laser to weld them together at a desired position. Alternatively, a mechanical locking mechanism could be used to affix the position of the top electrodes 84a and 85a relative to the bottom electrodes 84b and 85b, respectively.

Figure 10A:
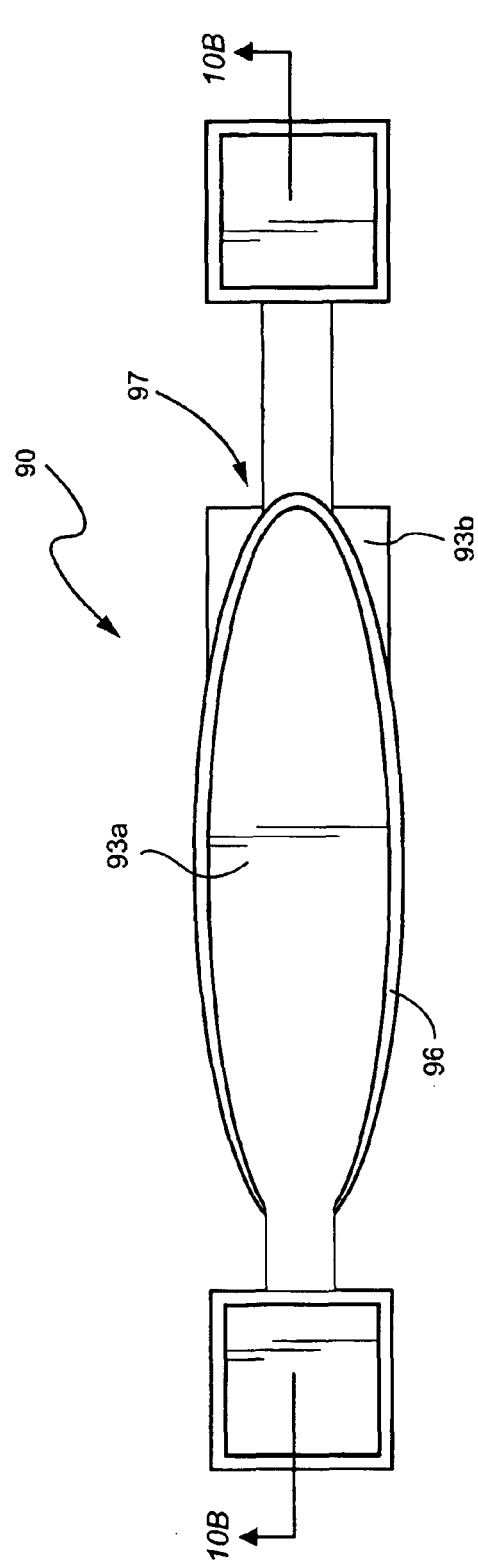
FIGS. 10A and 10B are a plan view and a side-sectional view showing a variable capacitor device in which the movable electrode is shaped to create a desired relationship between the applied actuation voltage and the deflection of the capacitor electrodes and thereby the capacitance of the device.
Figure 10B:
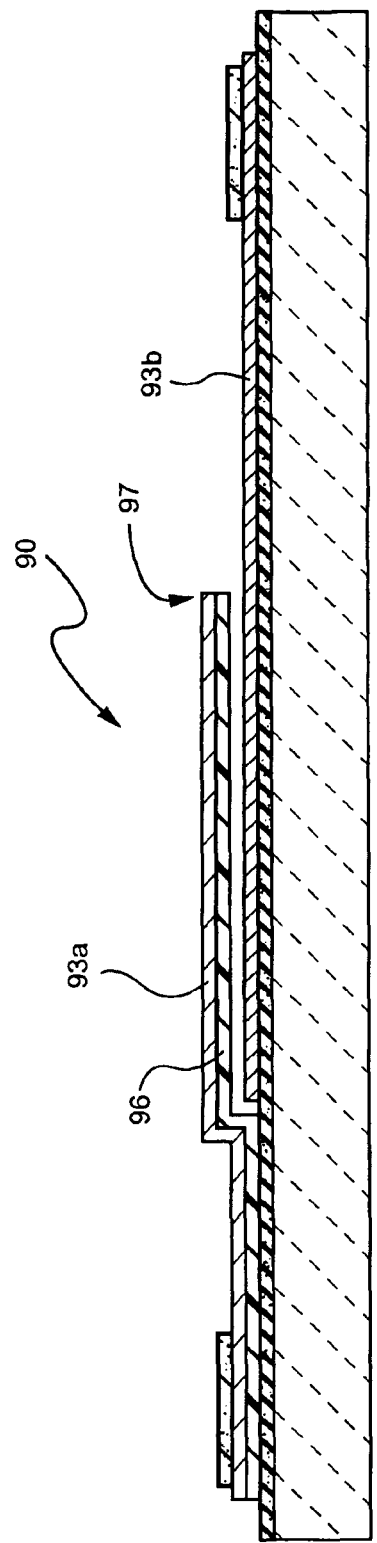

The embodiment of the present invention shown in FIGS. 10 and 10B is a variable capacitor 90, has a top electrode 93A shaped so as to create a desired relationship between the applied actuation voltage and the deflection of top electrode 93A relative to battery fixed electrode 93B, and thereby the capacitance of device 90. With square or rectangular shaped electrodes, the electrostatic force is a function of the voltage divided by the separation of the two electrodes squared. Consequently, since the "bending stiff" is usually a linear function of applied force, the relationship between the applied voltage and bending of the top electrode will be non-linear. Since the capacitance of the device is a function of the gap separating the two electrodes 93A and 93B of the capacitor, the relationship between actuation voltage and capacitance of the device will also be non-linear. In many circumstances, it is preferable to have the relationship between the actuation voltage and the capacitance of the variable capacitor be a linear function. FIGS. 10A and B show an embodiment which achieves this goal. The basic approach, as shown in FIGS. 10A and B is to tailor the stiffness of the cantilever electrode 93A so as to compensate for the non-linear applied voltage versus force relationship. The device shown in FIG. 10 accomplishes this by having the width of the cantilever 93A increase as a function of the distance end 97 of the structure 90. If the increase in the stiffness of the cantilever electrode 93A due to the increase in width matches the increased electrostatic force of the structure 90, then the relationship will be linear. Although not shown, there are other methods to accomplish this goal of linearizing the relationship between applied actuation voltage and resultant capacitance, such as having the thickness of the cantilever increase as a function of the distance from the free end 97, or increasing the modulus of the material of the cantilever 93A as a function of the distance from the free end 97 of cantilever 93A.

Although not shown in the drawings, the technique of shaping the electrodes to obtain a desired relationship between the applied actuation voltage and resultant capacitance can be combined with the device design variation shown in FIGS. 6 through 9 wherein the actuation and capacitor electrodes are distinct and separated from one another as in the device of FIGS. 6A–6B. Alternatively, the device of FIG. 10 can be combined with the improvement shown in FIGS. 7A–7C where the gap spacing between the actuation electrodes and greater than that of the capacitor electrodes. Additionally, dimples or standoffs such as shown in FIGS. 8A–8B could be used in device 90 shown in FIGS. 10A–10B. Additionally, two pair of extra electrodes could be used as such in FIGS. 9A–9C which can be used to weld or fuse the top cantilever into a desired position permanently.

While preferred embodiments of the variable capacitor of the present invention have been described as being fabricated on LTCC substrates, it is important to point out that the present invention includes innovative design features of the variable capacitor itself, irrespective of the type of substrate on which the variable capacitor is constructed. Consequently, the variable capacitor of the present invention includes all the features described herein, whether fabricated on LTCC or other substrates, such as semiconductors, glass, metals, or other ceramic materials.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A variable capacitor device comprising:
a first multi-layered substrate formed from a low-temperature, co-fired ceramic (LTCC) material,
a microelectromechanical device microfabricated on the a first substrate, the microelectromechanical device comprising a variable capacitor, and
a second multi-layered substrate formed from the LTCC material, a portion of the second substrate being removed to form a cavity therein,
the first and second substrates being bonded together to enclose the microelectromechanical device,
the microelectromechanical device being electrostatically actuated, wherein the capacitance of the device is controlled by a DC voltage applied to the device.

2. The variable capacitor device of claim 1, wherein the microelectromechanical device includes upper and lower electrodes, and wherein the DC voltage applied to the upper and lower electrodes controls the capacitance between the electrodes.

3. The variable capacitor device of claim 2, wherein the shape of the upper and lower electrodes, in addition to the applied DC voltage, controls the capacitance between the electrodes.

4. The variable capacitor device of claim 2, wherein the variable capacitor is tuned to a selected value and a short, low-voltage, high-current pulse of sufficient duration to essentially "weld" the electrodes together at the selected capacitance value is applied.

5. The variable capacitor device of claim 2, wherein a substantially fast curing polymer material is applied to the electrodes to affix them at a desired position whereby the device is locked in to a tuned capacitance value.

6. The variable capacitor device of claim 2, wherein the electrodes are welded by a high-powered laser to a tuned position whereby the device is locked into a selected capacitance value.

7. The variable capacitor of claim 2, wherein the upper electrode is shaped so as to create a substantially linear relationship between the applied DC voltage and the deflection of the upper electrode and thereby the capacitance between the upper and lower electrodes.

8. The variable capacitor of 7, wherein the upper electrode increases in width as a function of the distance from a free end of the upper electrode.

9. The variable capacitor of claim 2, wherein the upper electrode is shaped so as to create a substantially linear relationship between the applied DC voltage and the deflection of the upper electrode and thereby the capacitance between the upper and lower electrodes.

10. The variable capacitor device of claim 1, wherein the cavity enclosed in the first and second substrates bonded together contains a partial vacuum or an inert ambient gas to facilitate the operation and reliability of the microelectromechanical device.

11. The variable capacitor device of claim 1, wherein the first and second substrates include continuous electrical connections through their respective layers.

12. The variable capacitor device of claim 1, wherein the LTCC material has low resistive losses at frequencies above 30 GHz.

13. The variable capacitor device of claim 1, wherein the device is electronically tunable to a selected value and wherein a predetermined actuation voltage is applied to the upper and lower electrodes to maintain the capacitor device at the selected value.

14. The variable capacitor device of claim 1 further comprising a third substrate bonded to the second substrate, the third substrate including an integrated circuit flip-chip bonded onto electrical bonding pads fabricated onto the surface of the third substrate, the integrated circuit sensing and measuring the capacitance value of the variable capacitor and apply suitable actuation voltages to the device actuation electrodes to keep the capacitance of the device actively adjusted to the selected value.

15. The variable capacitor device of claim 1, wherein thin-films of materials are deposited, patterned and etched on the surface of the first substrate to form the microelectromechanical device.

16. The variable capacitor device of claim 1, wherein each LTCC substrate layer includes means for incorporating electrical connections and interconnections, through wafer vias, discrete components, sealable cavities, and bonded integrated circuits.

17. The variable capacitor device of claim 1, wherein the LTCC material has a low loss tangent and a high k factor value for high performance, high-frequency applications.

18. The variable capacitor device of claim 1, wherein the first and second substrates are bonded together using eutectic bonding.

19. The variable capacitor device of claim 1, wherein the first and second substrates are bonded together using a glass-frit technique.

20. The variable capacitor device of claim 1, wherein the first and second substrates are bonded together using a thermosetting polymer technique.

21. The variable capacitor device of claim 1, wherein the cavity provides a low-pressure, low humidity environment for the microelectromechanical device.

22. The variable capacitor device of claim 1, wherein a surface of the first LTCC substrate on which the microelectromechanical device is formed is micromachined to be smooth and uniform.

23. The variable capacitor device of claim 22, wherein the surface of the first LTCC substrate is micromachined by planarizing.

24. The variable capacitor device of claim 22, wherein the surface of the first LTCC substrate is micromachined by polishing.

25. The variable capacitor device of claim 1, wherein the thin-film materials are selected from the group consisting of gold, silver, platinum, and/or aluminum.

26. The variable capacitor device of claim 1, wherein the LTCC material has a dielectric constant of ($\Box \epsilon_r$) is 7.5+/−0.1 and a loss tangent is 0.001.

27. The variable capacitor device of claim 1, wherein the microelectromechanical device includes first and second pairs of actuation electrodes on either side of a third pair of electrodes forming a variable capacitor.

28. The variable capacitor device of claim 27, wherein each of the first and second pairs of actuation electrodes and the third pair of electrodes forming the variable capacitor includes a top electrode and a bottom electrode.

29. The variable capacitor device of claim 28, wherein each top actuation electrodes is formed on a dielectric layer that acts as a mechanical stop between such actuation electrodes and the bottom actuation electrodes.

30. The variable capacitor of 29, wherein at least one standoff is added to the dielectric layer on which the top actuation electrodes are formed, the at least one standoff preventing both the variable capacitor electrodes and the actuation electrodes from coming into contact during operation of the variable capacitor device to prevent dielectric charging or stiction.

31. The variable capacitor of 29, wherein at least one dimple is added to the dielectric layer on which the top actuation electrodes are formed, the at least one dimple preventing both the variable capacitor electrodes and the actuation electrodes from coming into contact during operation of the variable capacitor device to prevent dielectric charging or stiction.

32. The variable capacitor device of 28, wherein an electrostatic potential is applied to the two pair of actuation electrodes to produce an electrostatically generated force of attraction between said electrodes and cause the top activation electrodes to deflect and bend in the direction of the bottom activation electrodes, respectively, and thereby decreasing the gap between the top and bottom electrodes forming the variable capacitor.

33. The variable capacitor device of 28, wherein each of the pairs of activation electrodes has a gap between the top and bottom actuation electrodes greater than a gap between the top and bottom electrodes forming the variable capacitor. dimple preventing both the variable capacitor electrodes and the actuation electrodes from coming into contact during operation of the variable capacitor device to prevent dielectric charging or stiction.

34. The variable capacitor of 28, further including two additional pairs of electrodes on either side of the actuator electrodes, the two additional pairs of electrodes being fused together to lock the top variable capacitor electrode in a permanently deflected position to thereby fix the variable capacitor at a selected capacitance value.

35. The variable capacitor of 34, wherein the two additional pairs of electrodes are fused together by a current pulse of sufficient magnitude to slightly melt and fuse each of the additional pairs of electrodes together.

36. The variable capacitor of 34, wherein the two additional pairs of electrodes are fused together by a pulse from a high power laser of sufficient magnitude to weld each of the additional pairs of electrodes together.

37. A variable capacitor device comprising:
a first multi-layered substrate formed from a low-temperature co-fired ceramic (LTCC) material,
a microelectromechanical device microfabricated the first substrate and comprising a variable capacitor, the microelectromechanical device including:
a fixed electrode,
a movable electrode electrostatically actuated by a DC voltage applied to the movable electrode to vary the capacitance between the movable electrode and the fixed electrode, and
a mechanical stop to prevent the movable electrode from contacting the fixed electrode when the movable electrode is actuated, wherein an increased amount of area of the movable electrode is brought into contact with the mechanical stop in a zipper-like motion as the applied DC voltage is increased, whereby the capacitance between the movable electrode and the fixed electrode is varied as the amount of area of the movable electrode contacting the mechanical stop is varied, and
a second multi-layered substrate formed from the LTCC material, a portion of the second substrate being removed to form a cavity therein, the first and second substrates being bonded together to enclose the microelectromechanical device.

38. The variable capacitor device of claim 37, wherein an increased amount of area of the movable electrode is brought into contact with the mechanical stop in a zipper-like motion as the applied DC voltage is increased, whereby the capacitance between the movable electrode and the fixed electrode is varied as the amount of area of the movable electrode contacting the mechanical stop is varied.

39. The variable capacitor device of claim 38, wherein the electrodes are welded by a high-powered laser to a tuned position whereby the device is locked into a selected capacitance value.

40. The variable capacitor device of claim 37, wherein the shape of the movable and fixed electrodes controls the capacitance between said electrodes.

41. The variable capacitor device of claim 37, wherein the geometry of each of the movable and fixed electrodes determines the relationship between the capacitance between the movable and fixed electrodes and the DC voltage applied to said electrodes.

42. The variable capacitor device of claim 37, wherein a selected portion of the center area of the fixed electrode is removed to match the leveraging of the movable electrode to a non-linear relationship between the applied DC voltage and electrostatic force actuating the movable electrode to achieve a substantially linear relationship between the capacitance between the movable and fixed electrodes and the DC voltage applied to said electrodes.

43. The variable capacitor device of claim 37, wherein the device has a tuning ratio in excess of 100 with an applied actuation voltage of substantially less than 50V.

44. The variable capacitor device of claim 37, wherein the applied DC voltage controls the capacitance between the electrodes.

45. The variable capacitor device of claim 37, wherein the shape of the movable and fixed electrodes, in addition to the applied DC voltage, controls the capacitance between the electrodes.

46. The variable capacitor device of claim 37, wherein the cavity enclosed in the first and second substrates bonded together contains a partial vacuum or an inert ambient gas to facilitate the operation and reliability of the microelectromechanical device.

47. The variable capacitor device of claim 37, wherein the first and second substrates include continuous electrical connections through their respective layers.

48. The variable capacitor device of claim 37, wherein the LTCC material has low resistive losses at frequencies above 30 GHz.

49. The variable capacitor device of claim 37, wherein the device is electronically tunable to a selected value and wherein a predetermined actuation voltage is applied to the movable and fixed electrodes to maintain the capacitor device at the selected value.

50. The variable capacitor device of claim 37 further comprising a third substrate bonded to the second substrate, the third substrate including an integrated circuit flip-chip bonded onto electrical bonding pads fabricated onto the surface of the third substrate, the integrated circuit sensing and measuring the capacitance value of the variable capacitor and apply suitable actuation voltages to the device actuation electrodes to keep the capacitance of the device actively adjusted to the selected value.

51. The variable capacitor device of claim 37, wherein thin-films of materials are deposited, patterned and etched on the surface of the first substrate to form the microelectromechanical device.

52. The variable capacitor device of claim 37, wherein each LTCC substrate layer includes means for incorporating electrical connections and interconnections, through wafer vias, discrete components, sealable cavities, and bonded integrated circuits.

53. The variable capacitor device of claim 37, wherein the LTCC material has a low loss tangent and a high k factor value for high performance, high-frequency applications.

54. The variable capacitor device of claim 37, wherein the variable capacitor is tuned to a selected value and a short, low-voltage, high-current pulse of sufficient duration to essentially "weld" the electrodes together at the selected capacitance value is applied.

55. The variable capacitor device of claim 37, wherein a substantially fast curing polymer material is applied to the electrodes to affix them at a desired position whereby the device is locked in to a tuned capacitance value.

56. The variable capacitor device of claim 37, wherein the first and second substrates are bonded together using eutectic bonding.

57. The variable capacitor device of claim 37, wherein the first and second substrates are bonded together using a glass-frit technique.

58. The variable capacitor device of 37, wherein the first and second substrates are bonded together using a thermosetting polymer technique.

59. The variable capacitor device of 37, wherein the cavity provides a low-pressure, low humidity environment for the microelectromechanical device.

60. The variable capacitor device of 37, wherein a surface of the first LTCC substrate on which the microelectromechanical device is formed is micromachined to be smooth and uniform.

61. The variable capacitor device of 60, wherein the surface of the first LTCC substrate is micromachined by planarizing.

62. The variable capacitor device of 60, wherein the surface of the first LTCC substrate is micromachined by polishing.

63. The variable capacitor device of 37, wherein the thin-film materials are selected from the group consisting of gold, silver, platinum, and/or aluminum.

64. The variable capacitor device of 37, wherein the LTCC material has a dielectric constant of $(\epsilon_r)$ is 7.5+/−0.1 and a loss tangent is 0.001.

65. The variable capacitor device of 37, wherein the movable electrode is cantilevered.

66. The variable capacitor device of 37, wherein the mechanical stop is mounted on the fixed electrode.

67. A variable capacitor device comprising:
   microelectromechanical means for providing a variable capacitance,
   means for supporting the variable capacitance means, and
   means for enclosing in a cavity the variable capacitance means,
   the supporting means and the enclosing means each being formed from a plurality of layers of low-temperature, co-fired ceramic ("LTCC") material and being bonded together,
   the variable capacitance means being electrostatically actuated by an applied DC voltage to control the variable capacitance.

68. The variable capacitor device of 67, wherein the variable capacitance means includes movable and fixed electrodes, and wherein the DC voltage applied to the electrodes controls the capacitance between the electrodes.

69. The variable capacitor device of 68, wherein the shape of the movable and fixed electrodes, in addition to the applied DC voltage, controls the capacitance between the electrodes.

70. The variable capacitor device of 68, wherein the device is electronically tunable to a selected value and wherein a predetermined actuation voltage is applied to the movable and fixed electrodes to maintain the capacitor device at the selected value.

71. The variable capacitor device of 68, wherein the variable capacitor is tuned to a selected value and a short, low-voltage, high-current pulse of sufficient duration to essentially "weld" the electrodes together at the selected capacitance value is applied.

72. The variable capacitor device of claim 68 wherein a substantially fast curing polymer material is applied to the electrodes to affix them at a desired position, whereby the device is locked into a tuned capacitance value.

73. The variable capacitor device of 68, wherein the electrodes are welded by a high-powered laser to a tuned position whereby the device is locked into a selected capacitance value.

74. The variable capacitor device of 67, wherein the supporting and enclosing means bonded together contains a cavity containing a partial vacuum or an inert ambient gas to facilitate the operation and reliability of the variable capacitance means.

75. The variable capacitor device of 74, wherein the cavity provides a low-pressure, low humidity environment for the microelectromechanical device.

76. The variable capacitor device of 67, wherein the supporting and enclosing means include continuous electrical connections through their respective layers.

77. The variable capacitor device of 67, wherein the LTCC material has low resistive losses at frequencies above 30 GHz.

78. The variable capacitor device of claim 67 further comprising means, bonded to the supporting means for supporting an integrated circuit for sensing and measuring the capacitance value of the variable capacitor device and apply suitable actuation voltages to the movable and fixed electrodes to keep the capacitance of the device actively adjusted to the selected value.

79. The variable capacitor device of 67, wherein thin-films of materials are deposited, patterned and etched on a surface of the supporting means to form the variable capacitance means.

80. The variable capacitor device of 67, wherein each LTCC layer includes means for incorporating electrical connections and interconnections, through wafer vias, discrete components, sealable cavities, and bonded integrated circuits.

81. The variable capacitor device of 67, wherein the LTCC material has a low loss tangent and a high k factor value for high performance high-frequency applications.

82. The variable capacitor device of 79, wherein the thin-film materials are selected from the group consisting of gold, silver, platinum, and/or aluminum.

83. The variable capacitor device of 67, wherein the supporting and enclosing means are bonded together using eutectic bonding.

84. The variable capacitor device of 67, wherein the supporting and enclosing means are bonded together using a glass-frit technique.

85. The variable capacitor device of 67, wherein the supporting and enclosing means are bonded together using a thermosetting polymer technique.

86. The variable capacitor device of 67, wherein a surface of the supporting means on which the variable capacitance means is formed is micromachined to be smooth and uniform.

87. The variable capacitor device of 86, wherein the surface of the supporting means is micromachined by planarizing.

88. The variable capacitor device of 86, wherein the surface of the supporting means is micromachined by polishing.

89. The variable capacitor device of 67, wherein the LTCC material has a dielectric constant of $(\epsilon_r)$ is 7.5+/−0.1 and a loss tangent is 0.001.

90. A variable capacitor device comprising:
a first substrate formed from a selected material,
a microelectromechanical device microfabricated on the first substrate and comprising a variable capacitor, the microelectromechanical device including:
first and second pairs of actuation electrodes on either side of a third pair of electrodes forming a variable capacitor, each of the first and second pairs of actuation electrodes and the third pair of electrodes forming the variable capacitor including a movable electrode and a fixed electrode,
the movable actuation electrodes being electrostatically actuated by a DC voltage applied to said movable actuation electrodes to vary the capacitance between the movable electrode and the fixed electrode forming the variable capacitor, and
a second multi-layered substrate formed from the selected material, a portion of the second substrate being removed to form a cavity therein,
the first and second substrates being bonded together to enclose the microelectromechanical device.

91. The variable capacitor device of 90, wherein each movable actuation electrodes is formed on a dielectric layer that acts as a mechanical stop between such actuation electrodes and the bottom actuation electrodes.

92. The variable capacitor of 91, wherein at least one standoff is added to the dielectric layer on which the top actuation electrodes are formed, the at least one standoff preventing both the variable capacitor electrodes and the actuation electrodes from coming into contact during operation of the variable capacitor device to prevent dielectric charging or stiction.

93. The variable capacitor of 91, wherein at least one dimple is added to the dielectric layer on which the top actuation electrodes are formed, the at least one dimple preventing both the variable capacitor electrodes and the actuation electrodes from coming into contact during operation of the variable capacitor device to prevent dielectric charging or stiction.

94. The variable capacitor of claim 93, wherein the first and second substrates are formed from multiple layers of low temperature co-fired ceramic.

95. The variable capacitor device of 91, wherein an increased amount of area of the variable capacitor movable electrode is brought into contact with the mechanical stop in a zipper-like motion as the applied DC voltage is increased, whereby the capacitance between said movable electrode and the variable capacitor fixed electrode is varied as the amount of area of said movable electrode contacting the mechanical stop is varied.

96. The variable capacitor device of 90, wherein an electrostatic potential is applied to the two pair of actuation electrodes to produce an electrostatically generated force of attraction between said actuation electrodes and cause the top actuation electrodes to deflect and bend in the direction of the bottom actuation electrodes, respectively, and thereby decreasing the gap between the top and bottom electrodes forming the variable capacitor.

97. The variable capacitor device of 90, wherein each of the pairs of actuation electrodes has a gap between the top and bottom actuation electrodes greater than a gap between the top and bottom electrodes forming the variable capacitor.

98. The variable capacitor of 90, further including two additional pairs of electrodes on either side of the actuation electrodes, the two additional pairs of electrodes being fused together to lock the movable variable capacitor electrode in a permanently deflected position to thereby fix the variable capacitor at a selected capacitance value.

99. The variable capacitor of 98, wherein the two additional pairs of electrodes are fused together by a current pulse of sufficient magnitude to slightly melt and fuse each of the additional pairs of electrodes together.

100. The variable capacitor of 98, wherein the two additional pairs of electrodes are fused together by a pulse from a high power laser of sufficient magnitude to weld each of the additional pairs of electrodes together.

101. The variable capacitor of 98, wherein the first and second substrates are formed from multiple layers of low temperature co-fired ceramic.

102. The variable capacitor of 90, wherein the upper electrode forming the variable capacitor is shaped so as to create a substantially linear relationship between the applied DC voltage and the deflection of said upper electrode and thereby the capacitance between the upper and lower electrodes forming the variable capacitor.

* * * * *